US006975494B2

(12) United States Patent
Tang et al.

(10) Patent No.: US 6,975,494 B2
(45) Date of Patent: Dec. 13, 2005

(54) METHOD AND APPARATUS FOR PROVIDING WIDEBAND POWER REGULATION TO A MICROELECTRONIC DEVICE

(75) Inventors: Benjamim Tang, Hawthorne, CA (US); Kenneth Ostrom, Palos Verdes Estates, CA (US); Timothy Ng, Monterey Park, CA (US); Keith Nelson Bassett, Torrance, CA (US); Nicholas Robert Steffen, Redondo Beach, CA (US); Clifford Duong, Fountain Valley, CA (US); William Pohlman, Phoenix, AZ (US); Robert Carroll, Andover, MA (US)

(73) Assignee: Primarion, Inc., Tempe, AZ (US)

( * ) Notice: Subject to any disclaimer, the term of this patent is extended or adjusted under 35 U.S.C. 154(b) by 307 days.

(21) Appl. No.: 10/147,156

(22) Filed: May 15, 2002

(65) Prior Publication Data

US 2003/0006650 A1 Jan. 9, 2003

Related U.S. Application Data

(63) Continuation-in-part of application No. 10/104,039, filed on Mar. 22, 2002, now Pat. No. 6,819,537, and a continuation-in-part of application No. 10/103,980, filed on Mar. 22, 2002, and a continuation-in-part of application No. 10/104,833, filed on Mar. 21, 2002, now Pat. No. 6,791,302, and a continuation-in-part of application No. 10/104,199, filed on Mar. 21, 2002, now Pat. No. 6,809,504, and a continuation-in-part of application No. 09/945,187, filed on Aug. 31, 2001, and a continuation-in-part of application No. 09/771,756, filed on Jan. 29, 2001, now Pat. No. 6,429,630.

(60) Provisional application No. 60/359,593, filed on Feb. 26, 2002, provisional application No. 60/359,590, filed on Feb. 26, 2002, provisional application No. 60/300,014, filed on Jun. 21, 2001, provisional application No. 60/297,680, filed on Jun. 12, 2001, provisional application No. 60/297,678, filed on Jun. 12, 2001, and provisional application No. 60/291,159, filed on May 15, 2001.

(51) Int. Cl.[7] .............................. H02H 3/00; G05F 1/44
(52) U.S. Cl. ........................................... 361/64; 323/272
(58) Field of Search ................................ 323/272, 268, 323/273, 284, 286, 225, 226, 274, 271; 363/50, 56, 80, 89; 318/729, 730; 315/307, 315, 318; 361/111, 18, 92, 54, 58; 365/265, 227, 228, 189.1

(56) References Cited

U.S. PATENT DOCUMENTS 3,675,114 A   7/1972  Nercessian (Continued)

FOREIGN PATENT DOCUMENTS

| EP | 0 076 599 A2 | 4/1983 |
|---|---|---|
| EP | 0 779 568 A2 | 6/1997 |
| EP | 0 922 636 A1 | 6/1999 |
| WO | WO 00/28648 | 5/2000 |

OTHER PUBLICATIONS

Amoroso et al., "Single Shot Transient Suppressor (SSTS) for High Current High Slew Rate Microprocessor", Applied Power Electronics Conference and Exposition, Mar. 14, 1999.

(Continued)

Primary Examiner—Rajnikant B. Patel
(74) Attorney, Agent, or Firm—Theodore E. Galanthay

(57) ABSTRACT

A method, apparatus, and system for providing operating power and transient suppression power to a microelectronic device are disclosed. The system includes a primary regulator to supply nominal operating power and to respond to relatively slow transient events and a transient suppression regulator to respond to fast transient power events. The system also includes a sense circuit to detect when a transient event occurs and to send a signal to the transient suppression regulator to supply or sink current to the load in response to a sensed transient power event.

52 Claims, 26 Drawing Sheets

U.S. PATENT DOCUMENTS

| | | | |
|---|---|---|---|
| 3,729,671 A | * | 4/1973 | Jeffery et al. .................. 363/50 |
| 4,341,990 A | | 7/1982 | Davis |
| 4,346,332 A | * | 8/1982 | Walden ...................... 315/307 |
| 4,675,770 A | | 6/1987 | Johansson |
| 4,704,570 A | * | 11/1987 | Hopkins ..................... 318/729 |
| 5,278,489 A | | 1/1994 | Bowers |
| 5,394,077 A | | 2/1995 | Atsumi |
| 5,455,501 A | | 10/1995 | Massie |
| 5,563,838 A | | 10/1996 | Mart et al. |
| 5,574,697 A | * | 11/1996 | Manning .................... 365/226 |
| 5,627,460 A | | 5/1997 | Bazinet et al. |
| 5,629,608 A | | 5/1997 | Budelman |
| 5,705,919 A | | 1/1998 | Wilcox |
| 5,717,319 A | | 2/1998 | Jokinen |
| 5,777,383 A | | 7/1998 | Stager et al. |
| 5,822,166 A | | 10/1998 | Massie |
| 5,835,979 A | | 11/1998 | Hiraki et al. |
| 5,864,225 A | | 1/1999 | Bryson |
| 5,864,227 A | | 1/1999 | Borden et al. |
| 5,877,611 A | | 3/1999 | Brkovic |
| 5,914,873 A | | 6/1999 | Blish, II |
| 5,938,769 A | | 8/1999 | Hu |
| 5,945,941 A | | 8/1999 | Rich, III et al. |
| 5,963,439 A | | 10/1999 | Wuidart et al. |
| 5,987,615 A | | 11/1999 | Danstrom |
| 6,028,417 A | | 2/2000 | Ang et al. |
| 6,058,488 A | | 5/2000 | Eckhardt et al. |
| 6,064,187 A | | 5/2000 | Redl et al. |

OTHER PUBLICATIONS

Poon et al., "Very Fast Transient Voltage Regulators Based on Load Correction", 30th Annual IEEE Power Electronics Specialists Conference, "Annual Power Electronics Specialists Conference", vol. 1, 1999.

Zhou et al., "Investigation of Candidate VRM Topologies for Future Microprocessors Yvoltage Regulator Module", Applied Power Electronics Conference and Exposition, Feb. 15, 1998.

Wong et al., "VRM Transient Study and Output Filter Design for Future Processors", Proceedings of the 24th Annual Conference of the IEEE AACHEN, Aug. 31, 1998.

Intersil, "Transient Voltage Regulator DeCA Pitator", Feb. 1998, Data Sheet, pp 2–441 through 2–449.

Intersil, "Evaulation Tool Demonstrates DeCA Pitator Performance (HIP6200EVAL1)", Aug. 1998, Application Note, pp 4–58 through 4–66.

Amoroso, L. et al.; "Single Shot Transient Suppressor (SSTS) for High Current High Slew Rate Microprocessor"; Applied Power Electronics Conference and Exposition, 1999; Mar. 14–18, 1999; pp. 284–288.

* cited by examiner

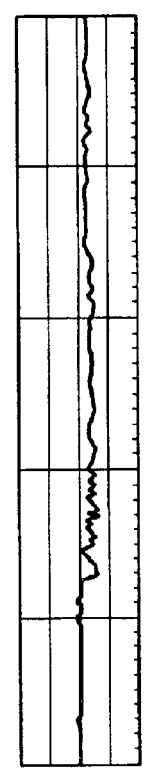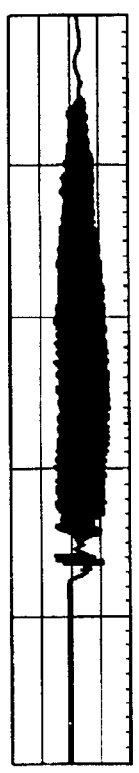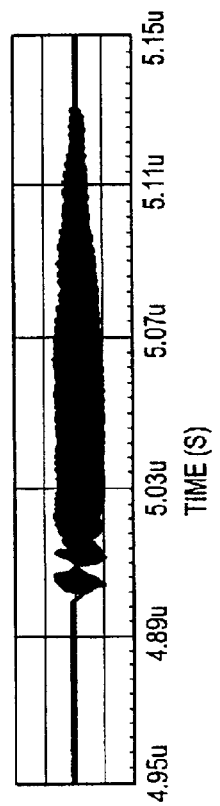
MULTI-THRESHOLD
FIG.10
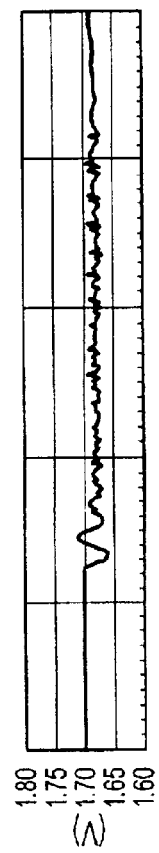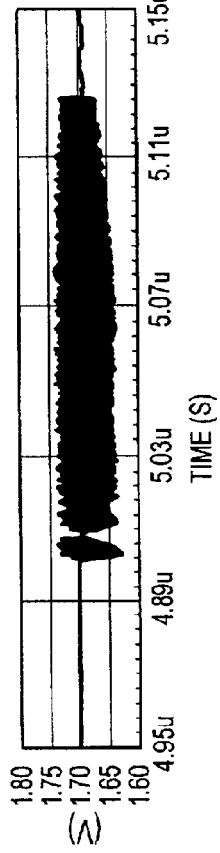
SINGLE THRESHOLD
FIG.9

☐ REGULAR TILE
▩ DECOUPLING CAPACITOR

METHOD AND APPARATUS FOR PROVIDING WIDEBAND POWER REGULATION TO A MICROELECTRONIC DEVICE

CROSS REFERENCE TO RELATED APPLICATIONS

This Application claims priority to Provisional Application Ser. No. 60/291,159, entitled METHOD AND APPARATUS FOR PROVIDING ADAPTIVE BROADBAND RELATED POWER TO A MICROELECTRONIC DEVICE, and filed on May 15, 2001, Provisional Application Ser. No. 60/300,014, entitled SYSTEM AND APPARATUS FOR WIDEBAND REGULATION OF DYNAMIC LOADS is USING DISTRIBUTED TRANSIENT SUPPRESSION, and filed on Jun. 21, 2001 Provisional Application Ser. No. 60/297,678, entitled DISTRIBUTED POWER REGULATION SYSTEM, and filed on Jun. 12, 2001; Provisional Application Ser. No. 60/297,680, entitled MULTI.-THRESHOLD VOLTAGE. REGULATOR, and filed on Jun. 12, 2001; Provisional Application Ser. No. 60/359,590, entitled SYSTEM, 20 APPARATUS AND METHOD FOR A DISTRIBUTED NONLINEAR VOLTAGE REGULATOR WITH LOCAL SENSE-FILTERED REFERENCE AND PROGRAMMABLE SLEW RATE ENHANCEMENT CONTROL, and filed on Feb. 26, 2002; Provisional Application Ser. No. 60/359,593, entitled SYSTEM, APPARATUS, AND METHOD FOR ROBUST DISTRIBUTED TRANSIENT SUPPRESSION WITH ADAPTIVE ACTIVITY MODES filed Feb. 26, 2002, and The instant application is continuation in part of following applications. The application filed on Feb. 26, 2002; Non-Provisional Application Ser. No. 09/771,756, now (U.S. Pat. No. 6,429,630), entitled APPARATUS FOR PROVIDING REGULATED POWER TO AN INTEGRATED CIRCUIT, and the application filed on Jan. 29, 2001; Non-Provisional Application Ser. No. 09/945,187, entitled EFFICIENT SHUNT REGULATOR FOR TRANSIENT SUPPRESSION, and the application filed on 30 Aug. 31, 2001; Non-Provisional Application Ser. No. 10/104,833, now U.S. Pat. No. 6,791,302, entitled METHODS AND APPARATUS FOR OPEN-LOOP CONTROL OF POWER SUPPLY TRANSIENTS, and the application filed on Mar. 21, 2002; Non-Provisional Application Ser. No. 10/104,199 now U.S. Pat. No. 6,809,504, entitled DUAL LQOP REGULATOR, and the application filed on Mar. 21, 2002; Non-Provisional Application Ser. No. 10/104,039, now U.S. Pat. No. 6,819,537, entitled FINE GRAIN POWER DELIVERY SYSTEM FOR MICROELECTRONIC DEVICES, and the application filed on Mar. 22, 2002; and Non-Provisional Application Ser. No. 10/103,980, entitled SYSTEM AND METHOD TO MAINTAIN VOLTAGE REGULATION DURING RAPID LOAD CHANGES IN VOLTAGE REGULATOR MODULES.

FIELD OF THE INVENTION

The present invention generally relates to microelectronic power regulation systems and components. More particularly, the invention relates to a tiered power regulation system and various components thereof configured to provide operating power and transient suppression power to a microelectronic device.

BACKGROUND OF THE INVENTION

Microelectronic power regulation systems generally include a power regulator configured to supply a desired, regulated power to a microelectronic device such as microprocessors, microcontrollers, memory devices, and the like. The system may also include capacitors located near and/or packaged with the microprocessor to supply additional charge during the operation of the microprocessor. Such power regulation systems are configured so that the power regulator (e.g., a switching regulator such as a Buck regulator) provides nominal operating power to the microprocessor and the capacitors supply charge to compensate for transient power demands that result from operation of the microelectronic device. Such transient power demands may occur, for example, when several transistors of the microprocessor switch in the same direction at approximately the same time—e.g., when a portion of the device is powered off to conserve power or a portion of the device is activated.

As the speed and integration of microprocessors increase, the use of power regulation systems that only employ decoupling capacitors to compensate for or regulate transient power demands becomes increasingly problematic. For example, the number and/or size of the capacitors required to account for transient events generally increases as the integration of the microprocessor increases. The capacitors take up a relatively large amount of space on the package and can be relatively expensive. In addition, as the speed and the performance of the microprocessor increases, the severity (e.g., the amplitude) of the transient power demands and the frequency of the events tend to increase. Further, the microelectronic devices often become more sensitive to degraded power waveforms, which result from transient events, as the integration and speed of the devices increase. Capacitors within typical power regulation systems may be unable to adequately regulate such sever transient power demands. If not regulated or filtered, transient power events may result in a power or ground "spike" or "bounce"—i.e., momentary voltage levels below or above the nominal operating voltage of the microelectronic device, which in turn induce bit errors in digital logic of the microelectronic device through degraded noise margin and supply-induced timing violations. Accordingly, improved apparatus for responding to transient events that result during operation of a microelectronic device are desired.

Furthermore, although typical Buck regulators are generally suitable for controlling power to some microprocessors, such regulators are not well suited to supply relatively high current (e.g., greater than about 30 amps) at relatively high speed (e.g., greater than about 100 kHz). One reason that Buck regulators have difficulty supplying high current at high speed to the microprocessor is that the regulator is configured to supply a single core operating voltage (Vcc) to the entire microprocessor. Supplying power from a single source and distributing the power to a limited number of locations of the microprocessor may be problematic in several regards. For example, various portions of the microprocessor may operate more efficiently at different amounts of power—e.g. at different current and/or voltage levels. To compensate for the different power requirements, the microprocessor may require additional components and integration to step the power up or down as needed. Such additional components and integration may undesirably add to the cost and complexity of the microprocessor and systems including the microprocessor. Further, supplying all or most of the power from a single regulated power source requires a relatively large power regulator, which is generally inherently slow to respond to changes in power demands.

Another problem associated with supplying the same operating power to a limited number of locations of a microprocessor is that microprocessor wiring schemes configured to distribute the regulator power to the microprocessor are generally complex and include relatively long wiring sections to supply power to sections of the device located away from the input source of the power. The relatively long wiring sections may cause delay and undesirable signal degradation or loss of the transmitted power. Accordingly, improved methods and apparatus for providing power to a plurality of portions of a microelectronic device and to supply various amounts of power to a plurality of locations on the microprocessor are desired.

SUMMARY OF THE INVENTION

The present invention provides improved apparatus and techniques for regulating power to a microelectronic device. More particularly, the invention provides improved devices and methods suitable for supplying operating power to a microelectronic device and for regulating or filtering transient power events.

The way in which the present invention addresses the deficiencies of now-known regulators and power supply systems is discussed in greater detail below. However, in general, the present invention provides a power regulation system capable of detecting and responding to transient power events.

In accordance with one exemplary embodiment of the present invention, a power regulation system in accordance with the present invention includes a primary regulator configured to supply power and low-frequency transient suppression power to one or more locations on a microelectronic device. In accordance with one aspect of this embodiment, the power regulation system also includes a plurality of secondary or transient suppression regulators coupled to the primary regulator and the microelectronic device and configured to respond to or account for high-frequency transient power demands. In accordance with one aspect of this embodiment, each transient suppression regulator is coupled to a portion of the microelectronic device, such that the plurality of regulators can supply relatively independent transient suppression to various portions of the microelectronic device.

In accordance with a further aspect of this embodiment, a secondary voltage regulator is configured in closed loop such that accurate voltage control may be obtained. In accordance with another aspect of the invention, a secondary regulators are configured in an open loop to quickly respond to the transient event. In accordance with another aspect of the invention, at least one secondary regulator includes both an open loop portion and a closed loop portion. In accordance with yet a further aspect of this embodiment, the power regulation system includes a controller coupled to the primary regulator to drive the primary regulator and adjust the operation of the primary regulator in response to or in anticipation of a transient power event.

In accordance with various embodiments of the invention, one or more of the secondary regulators include a programmable integrated circuit. In accordance with one or more aspects of this embodiment, the integrated circuit includes injector control, segmented current switch banks for sinking and/or sourcing current to the microelectronic device, a temperature monitor, a charge well monitor, programmable parameters, a serial interface for configuration, signal generators (e.g., to send signals to one or more of the primary regulators, or any combination of these elements.

In accordance with another embodiment of the invention, a power regulation system includes a plurality of primary regulators. In accordance with one aspect of this embodiment, each primary regulator is coupled to a different portion of a microelectronic device. In accordance with another aspect of this embodiment, two or more of the plurality of regulators are configured to provide different levels of power to the different portions of the microelectronic device. In accordance with yet another aspect of this embodiment, the power regulation system also includes at least one transient suppression regulator coupled to at least one of the primary regulators and the microelectronic device. In accordance various aspects of this embodiment of the invention, the secondary regulators are configured in an open loop and/or closed loop topology. In accordance with yet a further aspect of this embodiment, the power regulation system includes a controller, configured to receive a signal indicative of a transient event, coupled to the primary regulator, such that the controller drives the primary regulator in response to the transient event.

BRIEF DESCRIPTION OF THE DRAWINGS

A more complete understanding of the present invention may be derived by referring to the detailed description, considered in connection with the figures, wherein like reference numbers refer to similar elements throughout the figures, and:

FIGS. 9 and 10 illustrate electromagnetic interference for single and multiple threshold transient suppression regulators in accordance with the present invention;

FIGS. 29 and 30 schematically illustrate a portion of a power regulation system, including a plurality of transient suppression regulators and a plurality of capacitors, in accordance with the present invention;

FIG. 31 illustrates a power regulation system 3100 in accordance with another exemplary embodiment of the invention.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION OF EXEMPLARY EMBODIMENTS

The present invention is described herein in terms of various functional components and various processing steps. It should be appreciated that such functional components may be realized by any number of hardware or structural components configured to perform the specified functions. For example, the present invention may employ various integrated components comprised of various electrical devices, e.g., resistors, transistors, capacitors, diodes and the like, whose values may be suitably configured for various intended purposes. In addition, the present invention may be practiced in any integrated circuit application where high-frequency, low-voltage power requirements are desired. Such general applications that may be appreciated by those skilled in the art in light of the present disclosure are not described in detail. Further, it should be noted that while various components may be suitably coupled or connected to other components within exemplary circuits, such connections and couplings can be realized by direct connection between components or by connection through other components and devices located therebetween.

Figure 1:
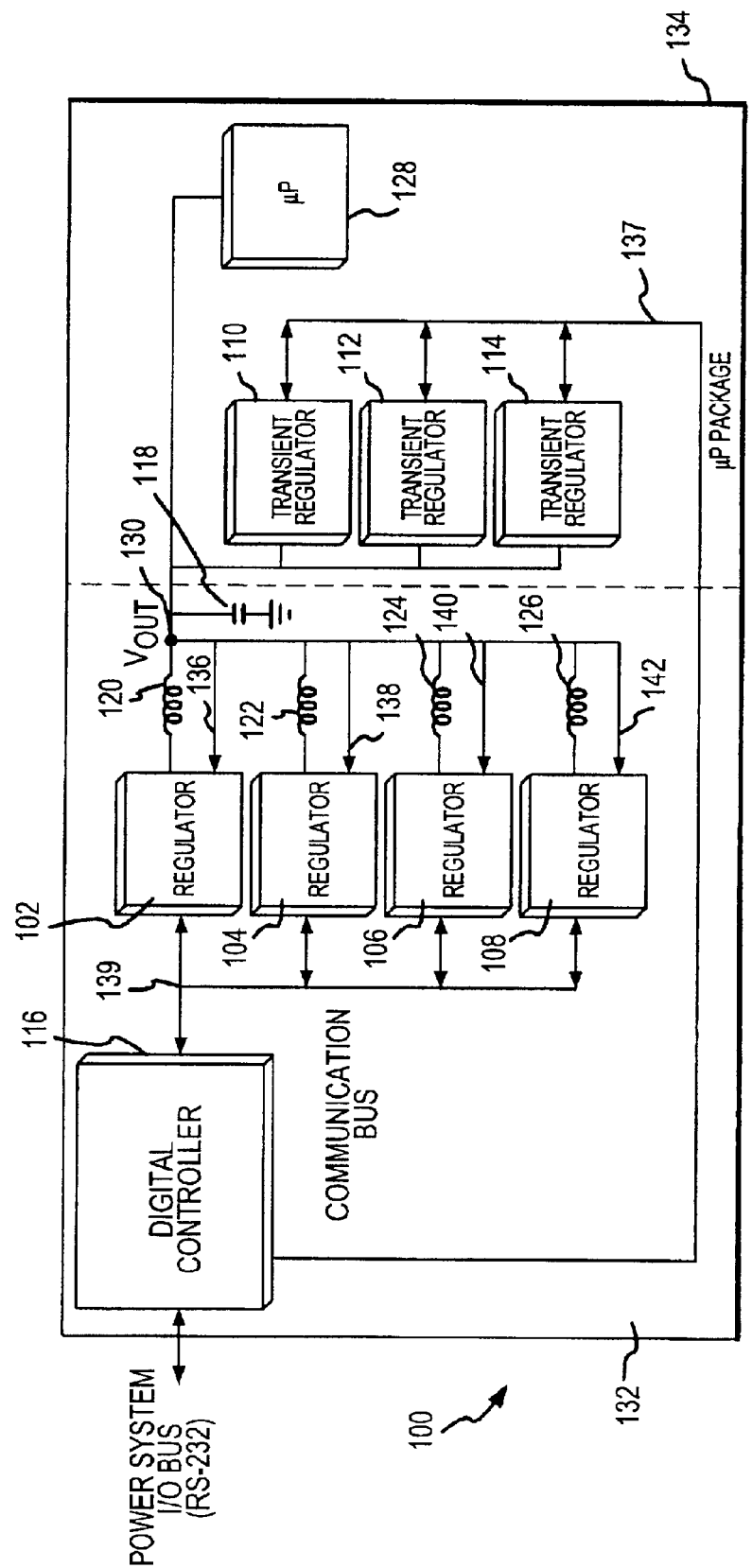
FIGS. 1, 7, 11–16, 29 and 31 are illustrations of power regulation systems in accordance with exemplary embodiments of the present invention.

FIG. 1 illustrates a power regulation system 100 in accordance with one exemplary embodiment of the invention. System 100 includes primary power regulators 102–108, transient suppression regulators 110–114, and a controller 116. System 100 may also suitably include one or more capacitors 118 and one or more inductors 120–126 coupled to a load 128. The capacitors and inductors may comprise discrete components and/or may symbolize inherent inductance and capacitance within system 100. Although exemplary system 100 is illustrated with four primary regulators 102-108, three transient regulators 110–114, four inductors 120–126, and one capacitor 118, power regulation systems in accordance with the present invention may include any suitable number of primary regulators, transient suppression regulators, inductors, and capacitors. Furthermore, power regulation systems in accordance with the present invention may include additional components, such as resistors, transistors, additional capacitors and/or inductors, and the like, which are not illustrated in the drawing figures.

In operation, system 100 provides operating power to a microprocessor 128 and also responds to transient events caused by the operation of microprocessor, e.g., a power surge due to, for example, multiple gates with the microprocessor switching in the same direction at about the same time or from a portion of the microprocessor powering up or down. More specifically, operating power and low-frequency (e.g., less than about 100 kHz) transient suppression power is supplied to microprocessor via regulators 102–108 and transient suppression regulators 110–114 supply high-frequency (e.g., greater than about 100 kHz) transient suppression power to the power supply circuit. As discussed in more detail below, regulators 102–108 may be configured to alter operation to respond to actual or predicted transient events and transient suppression regulators 110–114 may be configured to supply power in response to actual or predicted transient power demands from the microprocessor, such that any spikes or droops that would otherwise occur on the power circuit are reduced or eliminated.

As noted above, primary regulators 102–108 are configured to provide nominal operating power to microprocessor 128 and to provide low frequency transient suppression. By way of particular example, regulators 102–108 may be configured to provide about 1.1 volts±about ten percent at about 100 amps±ten percent to microprocessor 128 and respond to transient events occurring at less than about 100 kHz. However, regulators having other output voltages and current levels are within the scope of the present invention.

Regulators 102–108 may be configured in a variety of ways, such as, for example, a linear regulator, or a single or multi-phase switching regulator. In accordance with one exemplary embodiment of the invention, regulators 102–108 are three or four phase switching regulators tied to a common voltage node 130, through inductors 120–126. In accordance with alternate embodiments of the invention, regulators 102–108 may be replaced with a single multi-phase switching regulator. An exemplary primary regulator suitable for use with the present invention is described in greater detail in application Ser. No. 09/975,195, entitled SYSTEM AND METHOD FOR HIGHLY PHASED POWER REGULATION, filed Oct. 10, 2001, and application Ser. No. 10/103,980, entitled, SYSTEM, DEVICE AND METHOD FOR PROVIDING VOLTAGE REGULATION TO A MICROELECTRONIC DEVICE, filed Mar. 22, 2002, the contents of which are hereby incorporated herein by reference. Regulators 102–108 may be formed on a single substrate as part of an array or on separate substrates as discrete components. In either case, regulators 102–108 maybe coupled to another substrate (e.g., a substrate 132), such as a motherboard or an interposer. In addition, regulators 102–108 may suitably include feedback loops, represented by lines 136–142, to facilitate accurate control of the voltage at node 130. In accordance with one aspect of this embodiment, regulators 102–108 form an array configured to provide about 15 amps or more of power at about 1 MHz switching speed.

Transient regulators 110–114 may also be configured in a variety of ways in accordance with various embodiments of the invention. In general, regulators 110–114 are configured to quickly respond to fast, high frequency power demands. In other words, secondary regulators 110–114 are configured to reduce power spikes or droops in system 100 by providing or sinking power in response to transient power events. In accordance with various embodiments of the invention, regulators 110–114 are configured to sink and/or source current in response to a signal indicative of a transient response. In accordance with other aspects of this embodiment each transient regulator 110–114 is configured to independently respond to transient events that occur at one or more portions of microprocessor 128.

As discussed in greater detail below, systems in accordance with may include feedback loops, represented by lines 136 and 138 to allow communication between one or more transient regulators 110–114 and controller 116 and between one or more primary regulators 102–108 and controller 116. In this case, one or more of regulators 102–108 as well as one or more regulators 110–114 may alter operation mode in response to a sensed transient event. Systems of the present invention may also include communication lines between primary and transient response regulators to further facilitate rapid response to transient events.

Figure 2:
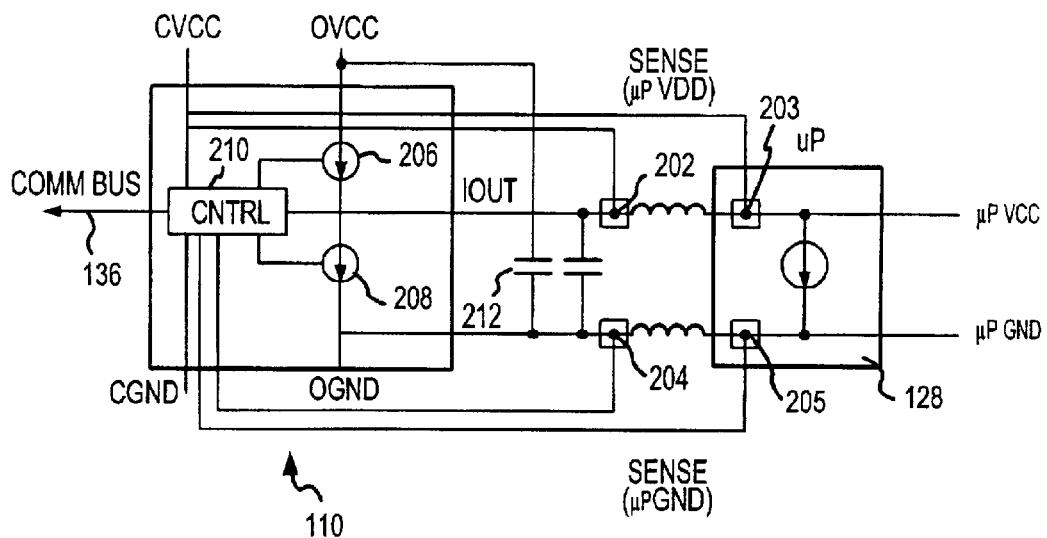
FIGS. 2, 18–20 are illustrations of exemplary transient suppression regulators in accordance with the present invention.

FIG. 2 schematically illustrates a transient power regulator (e.g., regulator 110) in greater detail. In accordance with this illustrated embodiment, transient regulator 110 includes sense circuits that measure at one or more sense points 202, 203, 204, and 205, a current source 206, a current sink 208, and a controller 210. In operation, a change in power is detected at one or more of points 202–205, and a representative signal is transmitted from at least one of the sense circuits to controller 210, which sends a corresponding signal to one or more of sources 206–208 to sink or supply charge in response to the sensed transient power event.

The system illustrated in FIG. 2 also includes a capacitor 212, e.g., a charge-well capacitor. In accordance with one aspect of this exemplary embodiment of the invention, capacitor 212 is formed as part of regulator 110 and serves as a local charge storage device that is used to assist with regulation of transient power events. As illustrated, capacitor 212 is replenished through an OVCC connection to a separate power supply, which need not have the high current and transient suppression requirements of the supply for load 128.

Figure 3:
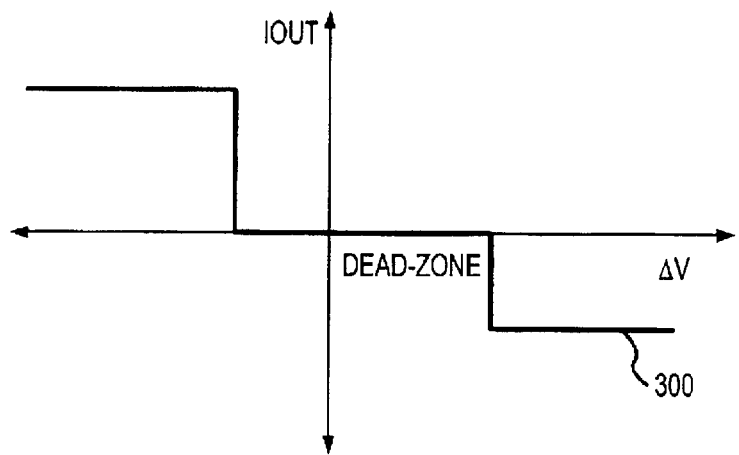
FIG. 3 is an illustration of a output of a secondary power regulator in accordance with one exemplary embodiment of the invention.

Sense circuits may be configured in a variety of ways in accordance with various embodiments of the invention. For example, sense circuits may be configured to sense a change in current, a rate of change of current, a change in voltage, a rate of change of voltage, or any combination thereof In accordance with various embodiments of the invention, the sense circuits and output devices operate in a nonlinear fashion to reduce the error voltage during fast changes in the dynamic load current. In this case, the output is typically either zero (or some negligible low value relative to the load current) or maximum amplitude (e.g., programmable in multiples of, for example 1.5 amps—i.e., 1.5A, 3.0 A, 4.5A . . . up to about 12A). The output device may be controlled by a nonlinear sense circuit that causes full switching of the output device as soon as the error voltage exceeds a predetermined threshold, in which case the magnitude of the output current is independent of the magnitude of the error voltage. This corresponds to transfer function 300, illustrated in FIG. 3.

Figure 4:
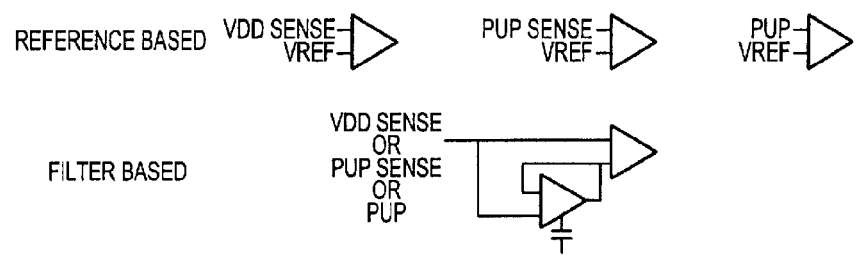
FIGS. 4–6 illustrate various sense circuits in accordance with exemplary embodiments of the invention.
Figure 5:
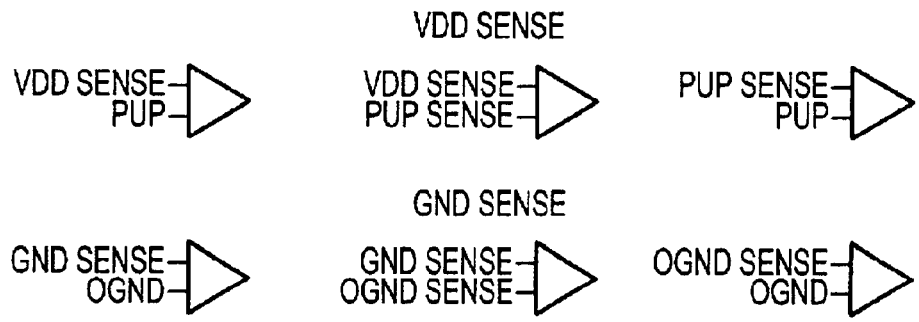

FIGS. 4 and 5 illustrate various sense circuits in accordance with exemplary embodiments of the present invention. More specifically, FIG. 4 illustrates exemplary voltage sense circuits and FIG. 5 illustrates exemplary di/dt sense circuits for use with the present invention. As discussed in more detail below, power regulation systems in accordance with the present invention may include one or more of the circuits represented in FIGS. 4 and 5, and in some cases preferably include at least one voltage sense circuit and one di/dt sense circuit.

Figure 6:
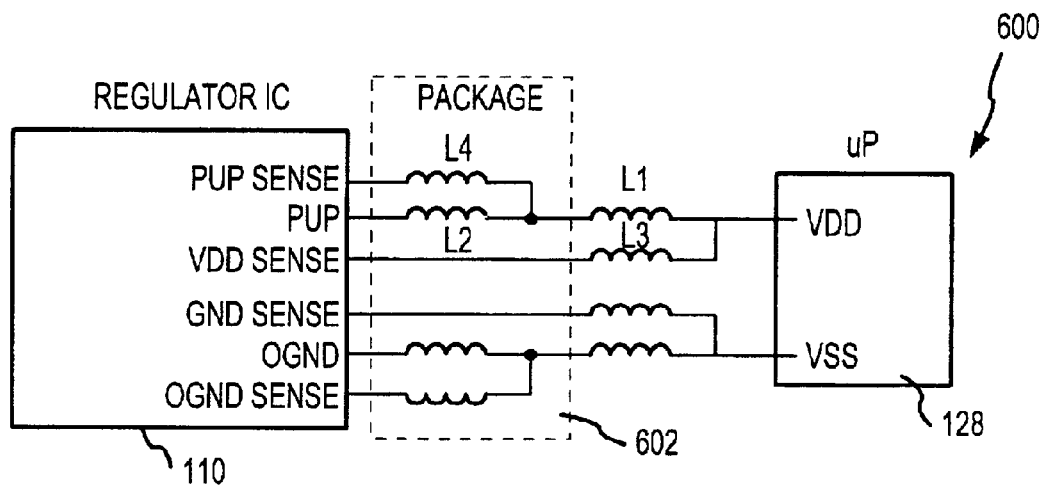

FIG. 6 illustrates a portion 600 of a regulation system, which is useful to illustrate how various input values for the circuits illustrated in FIGS. 4 and 5 may be obtained. As illustrated, portion 600 includes a transient suppression regulator 110 coupled to a package 602, which in turn is coupled to microelectronic device 128. The input "Vdd sense" can be measured across, for example: an inductance between Vdd an a power plane ("L1"), the inductance between the output of the transient suppression regulator (PUP) and the power plane ("L2"), or a combination of L1 and L2. Alternatively, the voltage at Vdd can be sensed at the microprocessor using a Kelvin probe across an inductor ("L3"). This is generally a more accurate voltage sense technique, but it is best measured using a dedicated pad or pin on the microprocessor for the measurement. If a pad is not available, a Kelvin probe may be coupled to the power supply plane ("L4") to generate "PUP Sense." Another technique for detecting change in voltage includes sensing the voltage at Vdd at the regulator 110 output PUP. This is generally a less desirable technique since it is generally less accurate than the other techniques described herein, but this technique can be used in connection with the invention if the total parasitic inductances L1 and L2 is sufficiently low. The microprocessor ground (Vss) can similarly be sensed in 3 locations, represented by the regulator 110 inputs GND sense, OGND sense, and OGND, which correspond to sensed voltage at the microprocessor ground, ground plane, and regulator grounds respectively.

As illustrated, the sense voltage can be compared in two ways: comparing the sense voltage against a fixed voltage, ("Vref") in the drawings or comparing the sense voltage with a filtered version of the sense voltage. The filtered-based technique allows the regulator to minimize or reduce the change in voltage during regulation. Vref can be decoupled to either GND sense, OGND sense, or OGND, depending on the desired routing for the sense circuit. Similarly, one of the three ground points can be used as the ground reference to filter the sense voltage Referring now to FIG. 6, the change in current in the Vdd terminal can be measured across either L1, L2, or L1+L2. To sense across L1, the voltage across Vdd sense and PUP sense are compared. To sense across L2, the voltage across PUP sense and PUP are compared. To sense across L1+L2, the voltage across Vdd sense and PUP are compared The change in current in Vdd can also be measured through the change in current through the Ground pins—e.g., GND sense, OGND sense, or OGND. The measured change in current sensed across the Vdd parasitic inductances, and the GND inductances can also be added together. This technique has the benefits of increasing the magnitude of the signal, improving the signal to noise ratio of the measurement, and providing common mode rejection.

Sense circuits in accordance with the present invention may be formed as part of secondary regulator 110, be discrete components, formed as part of a primary regulator, or formed as an integral part of microprocessor 128. Further, one sense circuit may be used to provide a signal to multiple regulators 110–114, or multiple sense circuits may be used to provide multiple signals indicative of, for example, transient events occurring at different locations within device 128 and/or power system 100.

Referring again to FIG. 1, digital controller 116 is configured to drive one or more regulators 102–108 and/or regulators 110–114. In accordance with various embodiments of the present invention, controller 116 is further configured to receive a signal from one or more sense circuits and send information to one or more regulators 102–108 and/or 110–114 based on the received signal. By way of example, the sense circuit may send a signal, indicating that a transient event has been detected, to controller 116. In this case, controller 116 in turn sends a signal to one or more primary regulators 102–108 to cause the regulators to alter output in response (e.g., to change operating mode to provide current to the microprocessor at a higher rate) to the sensed transient event. Controller 116 may also be configured to provide protection against excessive currents, excessive transient response activity, faults, and the like.

Controller 116 may be configured as an analog or digital controller. In accordance with one exemplary embodiment of the invention, controller 116 is a digital controller, which includes system monitoring devices. A more detailed description of an exemplary controller in accordance with the present invention is provided below in connection with FIG. 13.

FIGS. 7–12 and 14–16 illustrate transient suppression regulators, systems including the suppression regulators, and modes of operation of the regulators in accordance with additional embodiments of the invention. The illustrated regulators include features such as di/dt sensing for fast response to transient events, voltage sensing for more controlled response to the transient events, multiple-threshold sensing, as well as other features. The regulators described herein may be coupled together, in any combination, to form an array of transient suppression regulators as illustrated in FIG. 1. Some of the power regulation systems are illustrated without a controller such as controller 116. Such systems may be modified as described herein to include a controller and appropriate architecture that communicates with one or more of the primary regulators and/or one or more of the secondary regulators.

Figure 7:
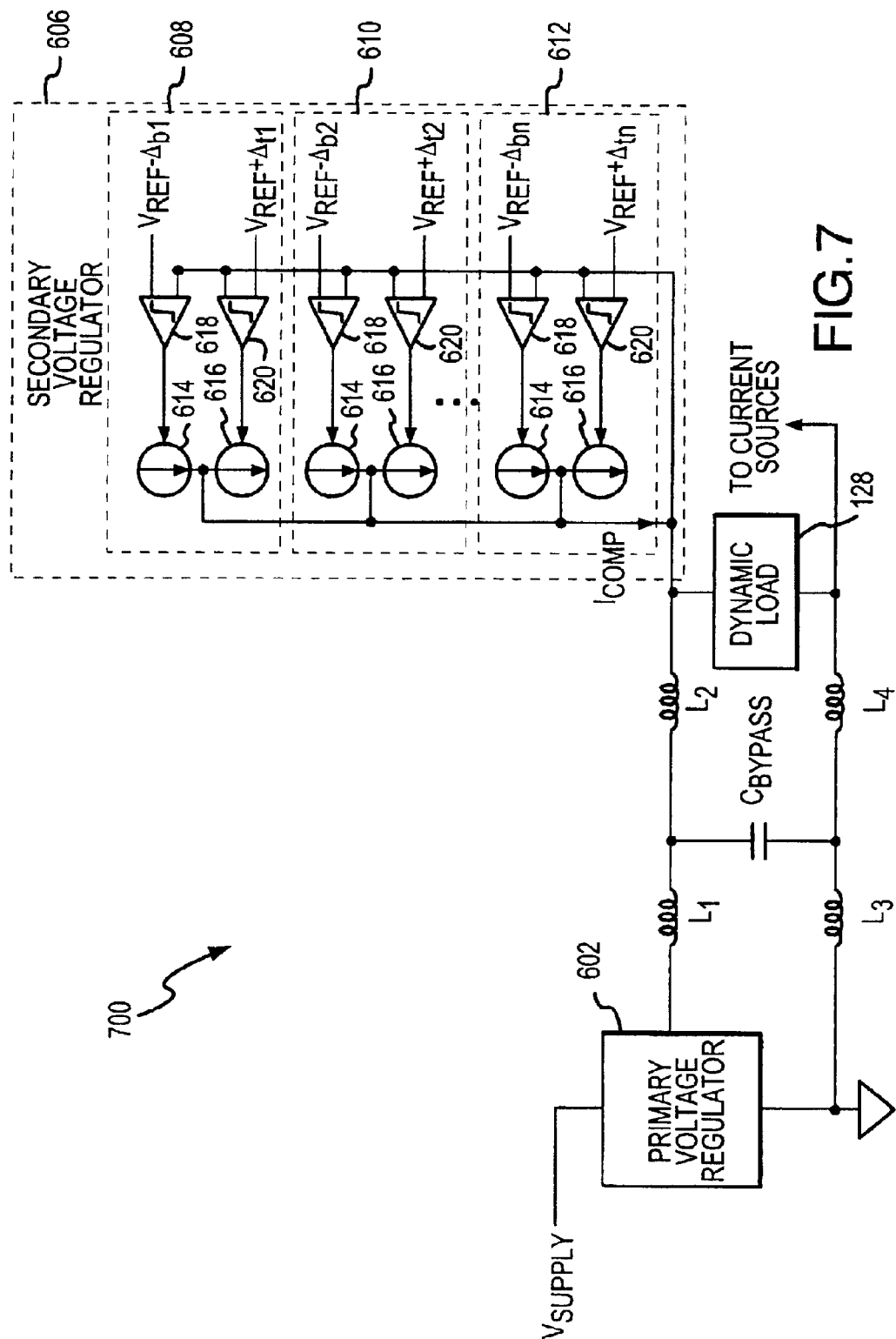

FIG. 7 illustrates a regulator system 600 including a multi-threshold secondary voltage regulator 606 configured with a plurality of pairs of comparators and current sources for sourcing and/or sinking current to a dynamic load. As illustrated, regulator system 600 includes a primary voltage regulator 602, a dynamic load (e.g., a microelectronic device) 128, and secondary voltage regulator circuit 606. Primary voltage regulator 602 can be configured similarly to that of primary voltage regulators 102–108. In addition, although not explicitly illustrated in FIG. 6, regulator system 600 can also include addition resistors and/or capacitors to facilitate increased stability of system 600. Power systems in accordance with additional embodiments of the invention may include a plurality of regulators 602 and/or 606, as illustrated in FIG. 1.

Secondary voltage regulator circuit 606 comprises a plurality N of secondary voltage regulator portions, e.g., secondary voltage regulator portions 608, 610 and 612. While three secondary voltage regulator portions are illustrated, secondary voltage regulator circuit 606 can have one regulator portion (in which case the regulator operates based on a single threshold value as described above), two secondary voltage regulator portions, or four or more secondary voltage regulator portions, depending on a desired transfer function for secondary voltage regulator circuit 606. The plurality of N of secondary voltage regulator portions can also be configured on the same integrated circuit or chip device, or resident within an array of two or more chip devices.

In the illustrative embodiment, each secondary voltage regulator portion 608, 610 and 612 suitably comprises a pair of comparators 618 and 620 configured with a pair of current sources 614 and 616 to facilitate sourcing of current to and sinking of current from dynamic load 128. In addition, each of secondary voltage regulator portion 608, 610 and 612 is suitably configured with separate undervoltage limits and overvoltage limits, e.g., secondary voltage regulator portion 608 is configured with undervoltage limit $\Delta_{b1}$ and overvoltage limit $\Delta_{t1}$, secondary voltage regulator portion 610 is configured with undervoltage limit $\Delta_{b2}$ and overvoltage limit $\Delta_{t2}$, and secondary voltage regulator portion 612 is configured with undervoltage limit $\Delta_{b3}$ and overvoltage limit $\Delta_{t3}$. In this case, the undervoltage and overvoltage limits of secondary voltage regulators 608, 610 and 612 do not overlap.

Current sources 614 and 616 for each of secondary voltage regulator portion 608, 610 and 612 can be configured to source and sink similar amounts of current to dynamic load 128. Alternatively, current sources 614 and 616 for each of secondary voltage regulator portion 608, 610 and 612 can be configured to source and sink different amounts of current corresponding to the appropriate undervoltage and overvoltage limits of secondary voltage regulator portions 608, 610 and 612. For example, for a larger undervoltage limit $\Delta_{bn}$, a current source 616 corresponding to secondary voltage regulator portion 612 can provide a larger amount of sourcing current, while for a smaller undervoltage limit $\Delta_{b1}$, a current source 616 corresponding to secondary voltage regulator portion 608 can provide a smaller amount of sourcing current. Such an exemplary embodiment can be effective at increasing the amount of current exponentially as the amount of error voltage increases.

Accordingly, secondary voltage regulator portion 608, 610 and 612 can have separate transfer functions that are triggered at different times and that may be combined to have a multiple-stepped transfer function, e.g., the output current of current sources 614 and 616 can be suitably summed for any of secondary voltage regulator portions 608, 610 and 612 once the undervoltage and overvoltage limits for any of secondary voltage regulator portions 608, 610 and 612 are reached.

Figure 8:
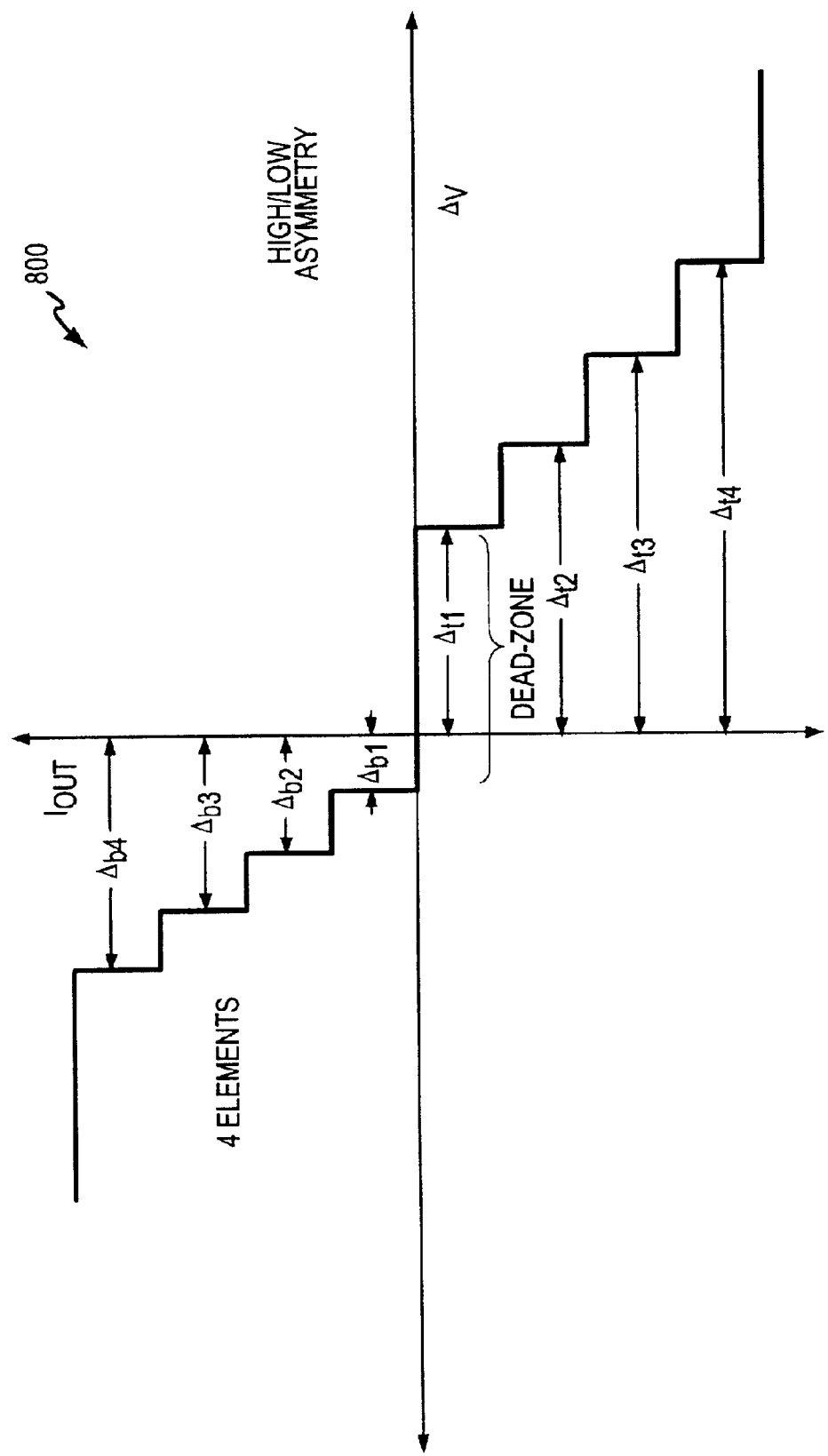
FIG. 8 illustrates a transfer function of a multiple-threshold transient suppression regulator in accordance with the present invention.

With reference to FIG. 8, for a secondary voltage regulator circuit comprising four secondary voltage regulator portions, a multiple-stepped transfer function 800 is illustrated. Transfer function 800 suitably comprises a plurality of stepped zones for regulation of a dynamic load. The stepped zones can be incremented equally, in gradually increasing or decreasing steps, or in any other suitable arrangement. In addition, the undervoltage and overvoltage limits for the stepped zones can be symmetrical or asymmetrical. Further, secondary voltage regulator portions 608, 610 and 612 can also be configured with various logic devices, such that only one of secondary voltage regulator portions 608, 610 and 612 can be turned on at the same time.

FIGS. 9 and 10 illustrate an advantage associated with using multi-threshold secondary regulators as described herein. In the case of a single-voltage threshold regulator, because the secondary regulator is a closed loop system, the net effect of the loop is to cause the output current to be pulse width modulated, such that the average output current provides the appropriate compensation current. This tends to provide a proportionate response that on average minimizes the error voltage, but with fast variations in the output current that may cause ripple in the supply, and potential problems due to electromagnetic interference (EMI).

One way to mitigate this effect is to slow down the response of the switch, such that the loop response is sufficiently fast and the output current excursions do not reach the minimum and maximum amplitude because the control input is pulse width modulated with a period significantly shorter than the time required to fully switch the output. This significantly reduces the variation in output current and reduces the ripple and EMI. The main requirement to accomplish this is that the circuitry providing the control circuitry be fast enough so that the output switch is always slewing in the correct direction. The amount of ripple in the output voltage is set by the gain, delay and hysteresis in the control circuitry. FIG. 9 compares the simulated closed loop step response of different speed switches, showing the change in ripple using a slow switch (first chart), medium speed switch, and fast switch (bottom).

FIG. 10 compares the simulated closed loop step response of different speed 4 threshold switches, showing the change in ripple using a slow switch (first chart), medium speed switch, and fast switch (bottom). As illustrated, the nonlinear regulator with the use of multiple threshold sense circuitry, multiple output devices, and controlled output switch response time reduces error voltage, ripple and EMI in the power regulation system.

Figure 11:
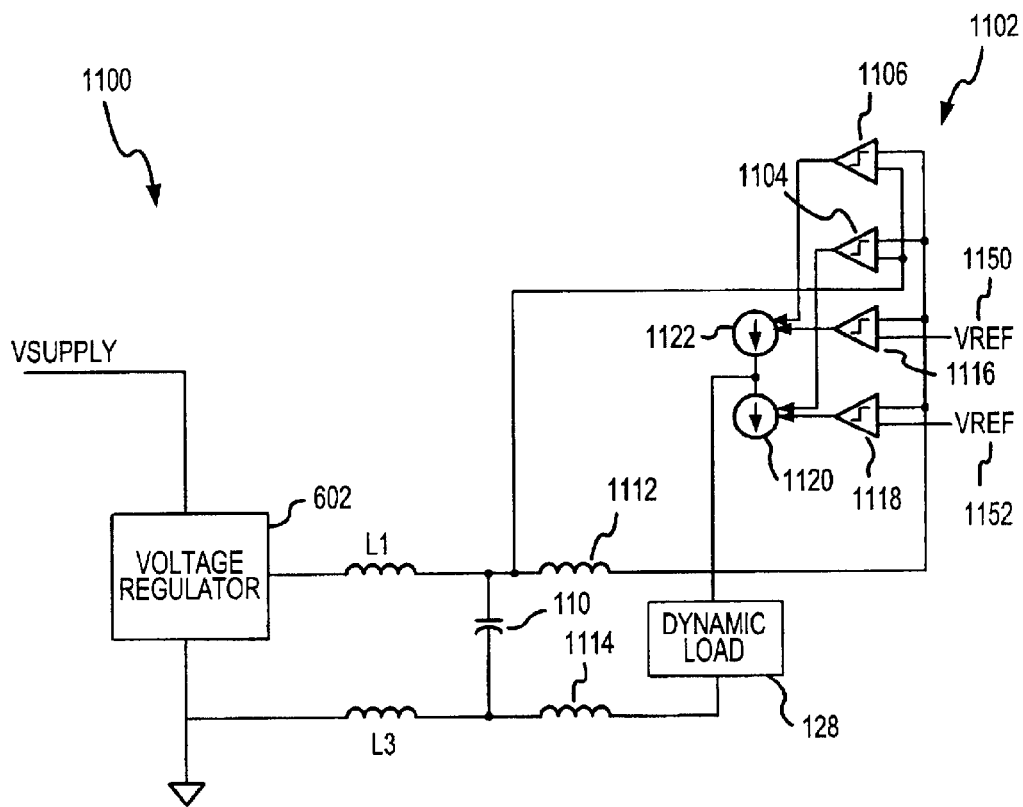

FIG. 11 illustrates an example of a system 1100, including a transient suppression wideband nonlinear regulator 1102 including combined di/dt sensing and voltage sensing, where the output devices (current sources 1122 and 1120) are shared between the two sensing elements. Comparators 1116 and 1118 are each connected to an appropriate reference voltage. For example, Comparator 1116 is connected to reference 1150, which is set at a predetermined slight negative offset from the desired reference, and comparator 1118 is connected to reference 1152, which is set at a predetermined slight positive offset from the desired reference. Additional regulators that may be used with system 1100 are described in application Ser. No. 10/104,833, filed Mar. 21, 2002, entitled METHODS AND APPARATUS FOR OPEN-LOOP CONTROL OF POWER SUPPLY TRANSIENTS, the contents of which is hereby incorporated by reference.

In accordance with the illustrated embodiment, the di/dt sensor comprises comparator 1104 and 1106 sensing the voltage across supply inductance 1112. In this case, a change in the current results in a voltage across supply inductance 1112. If more current is requested, comparator 1106 instructs current source 1122 to supply current to dynamic load 604. If negative current is requested, comparator 1202 instructs current source 1120 to sink current from dynamic load 112. The di/dt sensor responds to fast changes in the dynamic load that may cause a voltage drop across the supply or ground parasitic inductance. This parasitic inductance might be due to power traces on the die, package, or board, or due to chip and package-attach effects caused by bond wires, flip chip bumps, leads, and/or package balls.

The voltage sensor responds to changes in the actual load voltage, which is indicative of a longer sustained change in the dynamic load current. The sensed voltage can be compared with a target voltage derived either from a voltage reference or a lowpass-filtered version of the regulated voltage, or AC-coupled so it responds only to changes over a certain bandwidth.

In accordance with one aspect of this embodiment and as illustrated in FIG. 11, the voltage sense portion of regulator 1102 is a closed-loop voltage-sensing compensation circuit configured to compensate for transients falling within a mid-range frequency range, and the di/dt portion of regulator 1102 is an open-loop di/dt-sensing compensation circuit configured to compensate for transients falling within a high-frequency range. In accordance with various aspects of the invention, di/dt sense portions may be configured with an offset as described above in connection with voltage sense circuits.

Figure 12:
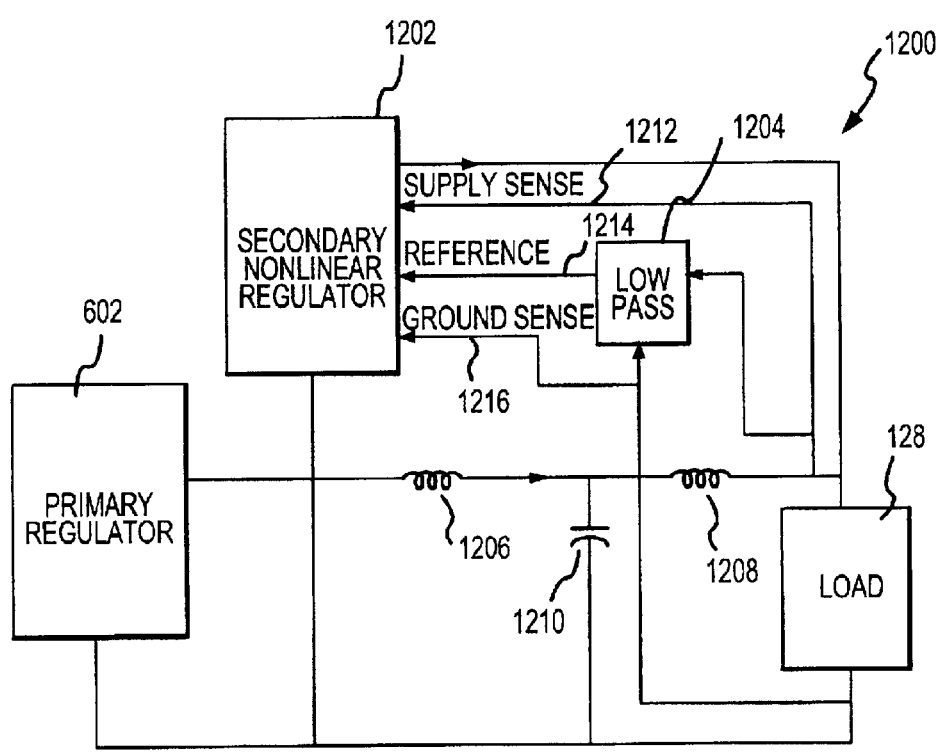

FIG. 12 illustrates a system 1200 including a primary regulator 602, a variable load 128, a secondary regulator 1202, and a low-pass filter 1204. Primary regulator 602 is coupled to load 604 through inductances 1206 and 1208 as well as capacitor 1210. Secondary nonlinear regulator 1202 provides current to load 604 in response to supply sense 1212, reference 1214, and ground sense 1216. In this case, low-pass filter 1204 is employed as shown to generate the target reference 1214.

A voltage-sensed boost current in secondary nonlinear regulator 1202, which is inherently slower than di/dt sensing and has a maximum bandwidth of about 1 GHz, can bridge the bandwidth gap between primary regulator 602 and di/dt sensing regulation. Thus, full bandwidth regulation can be achieved, wherein the regulation bandwidth is partitioned into three regions: primary regulator, secondary voltage-sensed regulator, and secondary di/dt sensed regulator.

Figure 13:
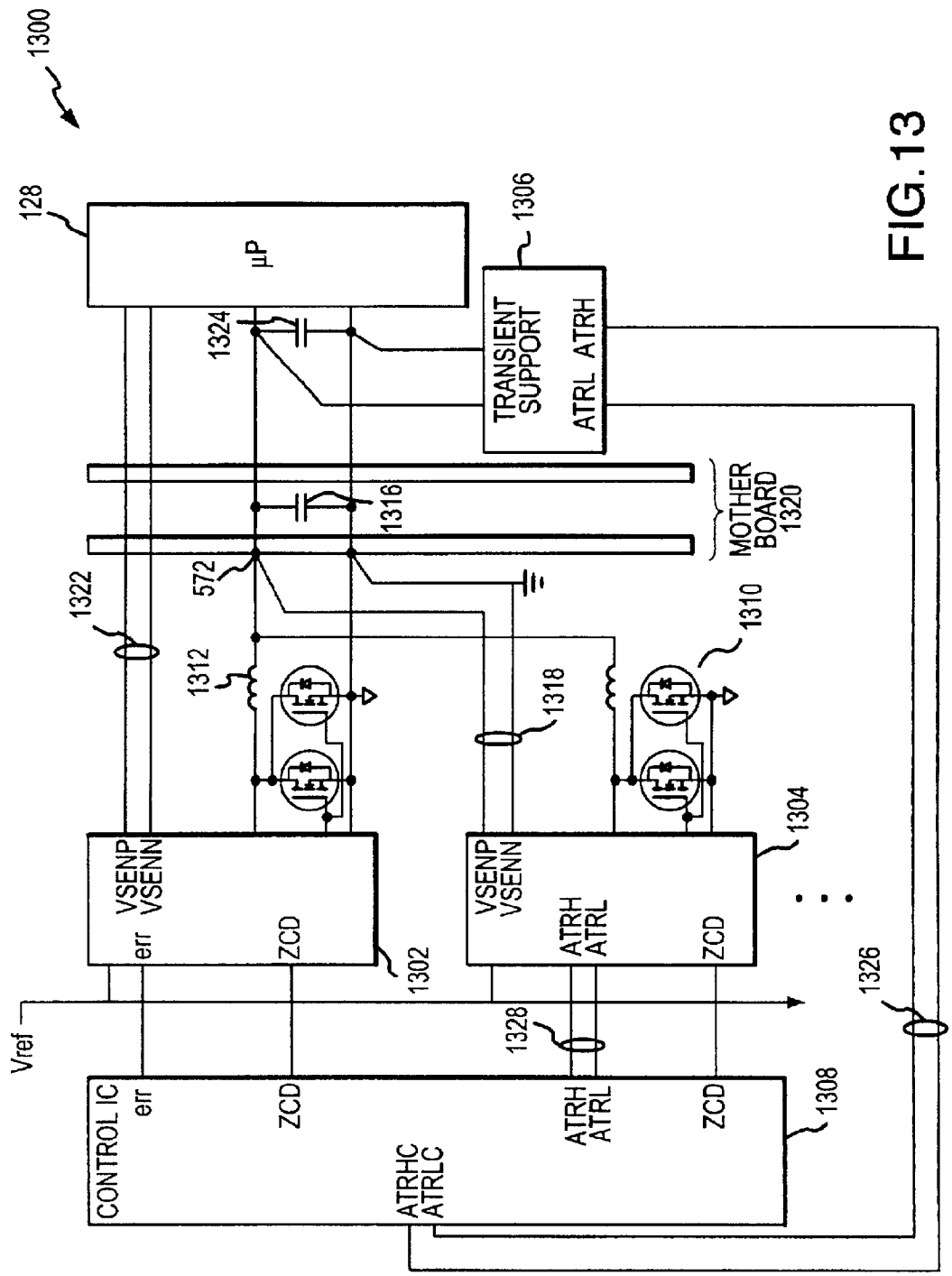

As noted above, the regulators illustrated in FIGS. 2, 7, and 11–12 may be coupled to a controller to enable a primary regulator to receive a signal indicative of a transient event, such that the primary regulator may also respond to the transient event. FIG. 13 illustrates a system 1300 in accordance with yet a further embodiment of the invention, including a controller that communicates with both the primary and the transient suppression regulator. Similar to system 100, system 1300 includes a primary regulator, a secondary or transient response regulators 1306, and a controller 1308 coupled to at least one of the primary regulators and at least one of the secondary regulators. Although system 1300 is illustrated with only one transient response regulator and two primary regulator circuits, systems in accordance with the present invention may include any suitable number of primary and transient response regulators, and often preferably include an array of transient response regulators as described herein.

In the illustrated embodiment, the functions of a primary regulator are performed, by two regulator circuits or portions 1302 and 1304; however, one or more than two circuits are within the scope of the invention. The multiple power regulator circuits can be configured to perform different tasks in accordance with various embodiments of the invention. For example, some power regulator circuits may be configured to sense transient activity or to receive signals from sensors indicating the presence or absence of transient activity (e.g., using techniques described above in connection with FIGS. 4 and 5). In this case, one or more of the power regulators or regulator circuits can be configured to respond to detected transient events. In an exemplary embodiment of the present invention, first power regulator circuit 1302 is a regulation mode power circuit configured to maintain the voltage regulation during nominal operation periods (e.g., periods without significant transient activity). Second power circuit 1304, in contrast, is a voltage transient mode power circuit configured to sense and respond to transient events. In other exemplary embodiments of the present invention, a single power regulator circuit may perform both functions. In this case, a single output phase is generated with either the single power circuit or with the dual power circuits.

Additional power circuits or pairs of power circuits may be combined in parallel with first and second power circuits 1302 and 1304 to form additional power supply output phases. For example, 8 power circuits may be combined in parallel to form an 8 channel or 8 phase voltage regulator. Controller 1308 may be configured to independently control each power circuit to perform voltage regulation.

System 1300 may include a plurality of power circuits configured to provide power to multiple loads or to a plurality of portions of a load, as described in more detail in connection with FIG. 31. In this case, controller 1308 is configured to independently manage the voltage regulation to these multiple loads or portions. It should be appreciated that any number of power circuits may be coupled together to provide regulated voltage to one or more loads or one or more portions of a single load.

In accordance with exemplary embodiments of the invention, a low-side switch 1310 is external of the power IC; however, such is not required to practice the present invention. Generally, power circuits 1302 and 1304 may be configured to alternately couple inductors 1312, 1314 between the source voltage and a ground potential based on control signals generated by the respective control circuit. During transient load events, any number of output inductors 570 may be coupled simultaneously to either the voltage source or ground potential as needed by the load(s). In addition, the inductance of inductors 1312 and 1314 can vary depending upon input and output requirements. Capacitance 1316 provides DC filtering of inductor currents and further acts as a charge well during load transient events.

In accordance with exemplary embodiments of the invention, regulation mode power circuit 1304 receives voltage level feedback via Vsense signal lines 1318. Power circuit 1304 may be configured, for example, to sense voltage levels at the power regulator input to motherboard 1320. Furthermore, variable load 128 (e.g., a microprocessor) may internally sense and report on the voltage regulation and provide this information over voltage feedback lines 1322. System 1300 may also suitably include one or more capacitors, e.g., 1316 and 1324, in parallel with load 128. For example, load capacitor 1324 may be located in relative proximity to load 128, and motherboard capacitor 1316 represents system capacitance internal to motherboard 1320. The capacitors provide output filtering, among other things, and may be inherent or comprise additional discrete components.

In operation, system 1300 performs quiescent voltage regulation while monitoring for load transients. As noted above, a transient condition arises if, for example, microprocessor 128 begins to use an increased amount of current. In this event, the voltage level across load 128 immediately droops. In accordance with an exemplary embodiment of the present invention, the existence of transient activity is generally first detected by transient suppression regulator 1306, which may comprise any of the transient regulation circuits described herein, and later detected by a power circuit 1304, although both the transient suppression regulator and the power circuit monitor for transient activity at the same time. In this exemplary embodiment, early detection of transient activity by transient regulator 1306 is facilitated, for example, by the proximity of the detection device to the load. Transient regulator 1306 is configured to respond to the transient activity by immediately sourcing or sinking current directly to the load, as described above.

In accordance with another exemplary embodiment of the present invention, upon detection of transient activity, transient regulator 1306 generates ATR signal(s) and transmits the ATR signal(s) directly to controller 1308 via ATRHC/ATRLC signal lines 1326. The ATR signal, in one embodiment includes an ATR high ("ATRHC") signal representing a voltage decrease, and an ATR low ("ATRLC") signal representing a voltage increase. The ATRHC and ATRLC signals provide early notification to controller 1308 that transient activity is taking place and thus controller 1308 is able to implement an early response to the transient activity. Note that one or more regulators may be configured to generate the signals transmitted to controller 1308.

In response to the transient detection signals, controller 1308 implements an early active transient response. More particularly, controller 1308 drives power circuit 1304 to initiate transient response steps, discussed in further detail below.

As mentioned above, in one exemplary embodiment of the present invention, power circuit 1304 generally detects transient activity later than transient regulator 1306. In accordance with one embodiment of the invention, by the time power circuit 1304 detects the transient activity, power circuit 1304 is already being driven by controller 1308 to respond to the transient. In this case, after power circuit 1304 detects the transient activity, circuit 1304 generates and transmits to controller 1308 its own ATRH and ATRL signals along lines 1328. Until this point, controller 1308 has been driving a primary regulator response to the transient event based on ATRLC/ATRHC signals from regulator 1306. In accordance with an exemplary aspect of this embodiment, controller 1308 further includes gating logic which determines an appropriate point in time for controller 1308 to handoff the transient suppressor ATRLC/ATRHC signals to the power circuit ATRL/ATRH signals. Then, controller 1308 continues to drive the power circuit to respond to the transient event based on the primary regulator ATRL/ATRH signals. After the power circuit responds to the transient event, controller 1308 drives recovery from the active transient response mode.

As discussed above, an abrupt change in load current causes an abrupt deviation in the output voltage from the voltage set point. Conventional voltage regulation may eventually return the voltage to the desired set point, but typically 3 or more spikes/droops result from the transient activity before the voltage at the load is returned to a nominal value. A power regulation system, in one exemplary embodiment of the present invention, is configured to reduce the third spike/droop by providing an active voltage positioning feature. This feature provides an offset to the reference point by an amount proportional to the sensed load current step and thereby causes the loop to settle at approximately the peak of the third spike/droop. The actual load voltage set point remains at the original level because the voltage level provided by the SPC is offset by an additional amount proportional to sensed load current.

In one exemplary aspect of the present invention, during non-transient regulation mode operation, voltage and/or current are sensed to provide feedback on the voltage regulation process. Sensors may be physically located inside or outside of power circuit 1302. For example, power circuit output voltage level is communicated from a voltage sensor external of power circuit 1302 to power IC VSENSE input ports via feedback lines 1322. Each power circuit 1302 has a voltage and/or current analog-to-digital converter ("ADC") that converts the analog signals, such as the analog VSENSE signal, from the voltage sensor and/or current sensor to their digital equivalent representations. Power circuits may be configured to derive a voltage error signal and provide the voltage error signal to controller 1308. Power circuit 1302 may also provide to controller 1308 a digital representation of the load current. Power circuit 1302 may also be configured to drive control signals to the semiconductor power switches in power circuit 1302 to regulate the voltage.

Controller 1308 may be suitably configured to receive the ATR signals from a window comparator and either alone or in combination with the digital voltage and current information received, controller 1308 may adjust the load voltage, set voltage, or manipulate other system components as needed to coordinate precise control of the output voltage. In an exemplary embodiment of the present invention, controller 1308 includes a digital compensator which receives the voltage error signal Verr and the active voltage positioning current signal, Iavp. The Verr signal represents the difference between the reference voltage and the sensed load voltage. The Iavp signal represents the scaled load current that provides the active voltage positioning offset to the reference voltage. Two exemplary implementations of a digital compensator as well as other power regulation systems including a controller are discussed in greater detail in application Ser. No. 10/103,980, entitled, SYSTEM, DEVICE AND METHOD FOR PROVIDING VOLTAGE REGULATION TO A MICROELECTRONIC DEVICE, filed Mar. 22, 2002.

Figure 14:
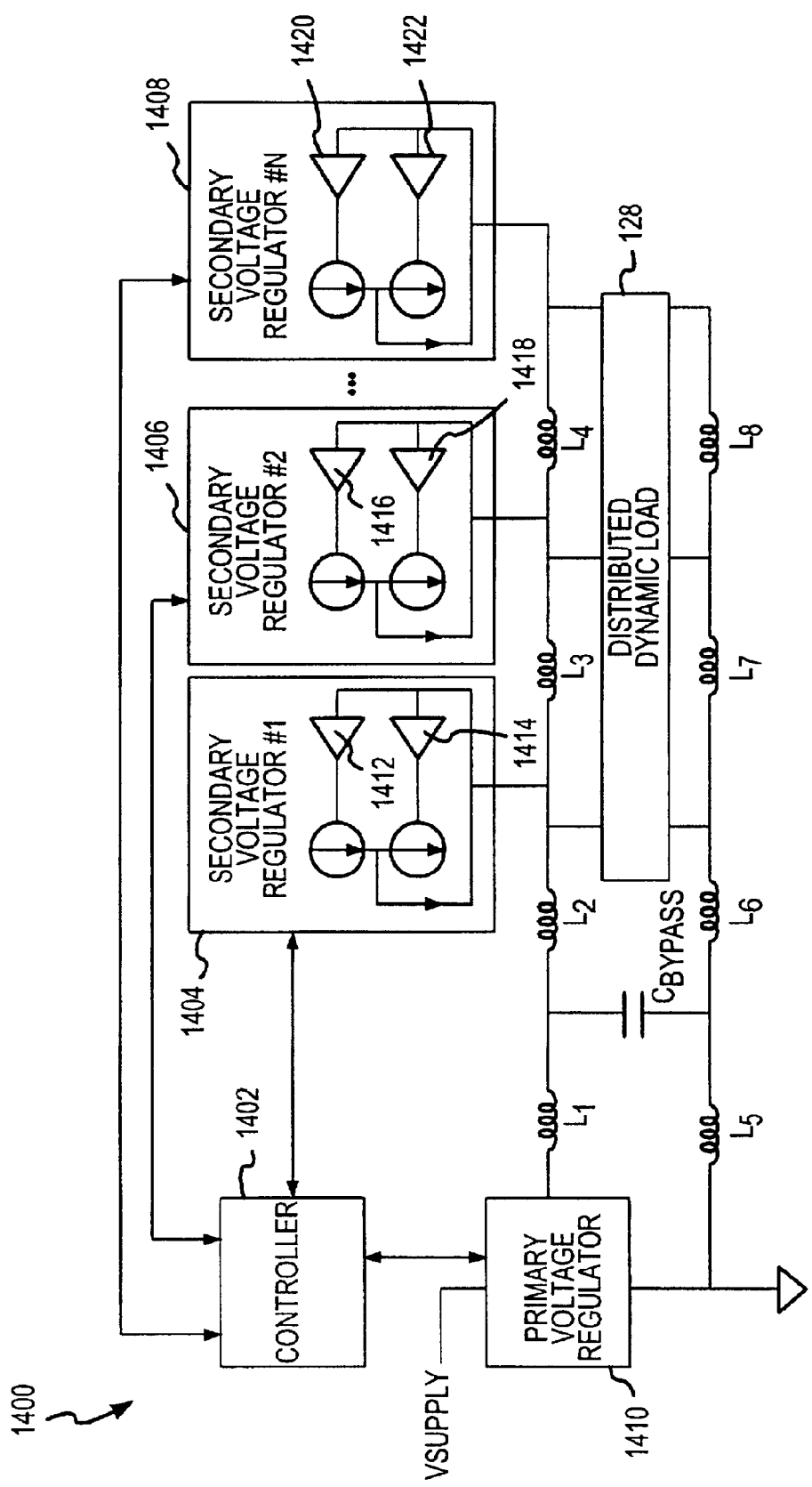
Figure 15:
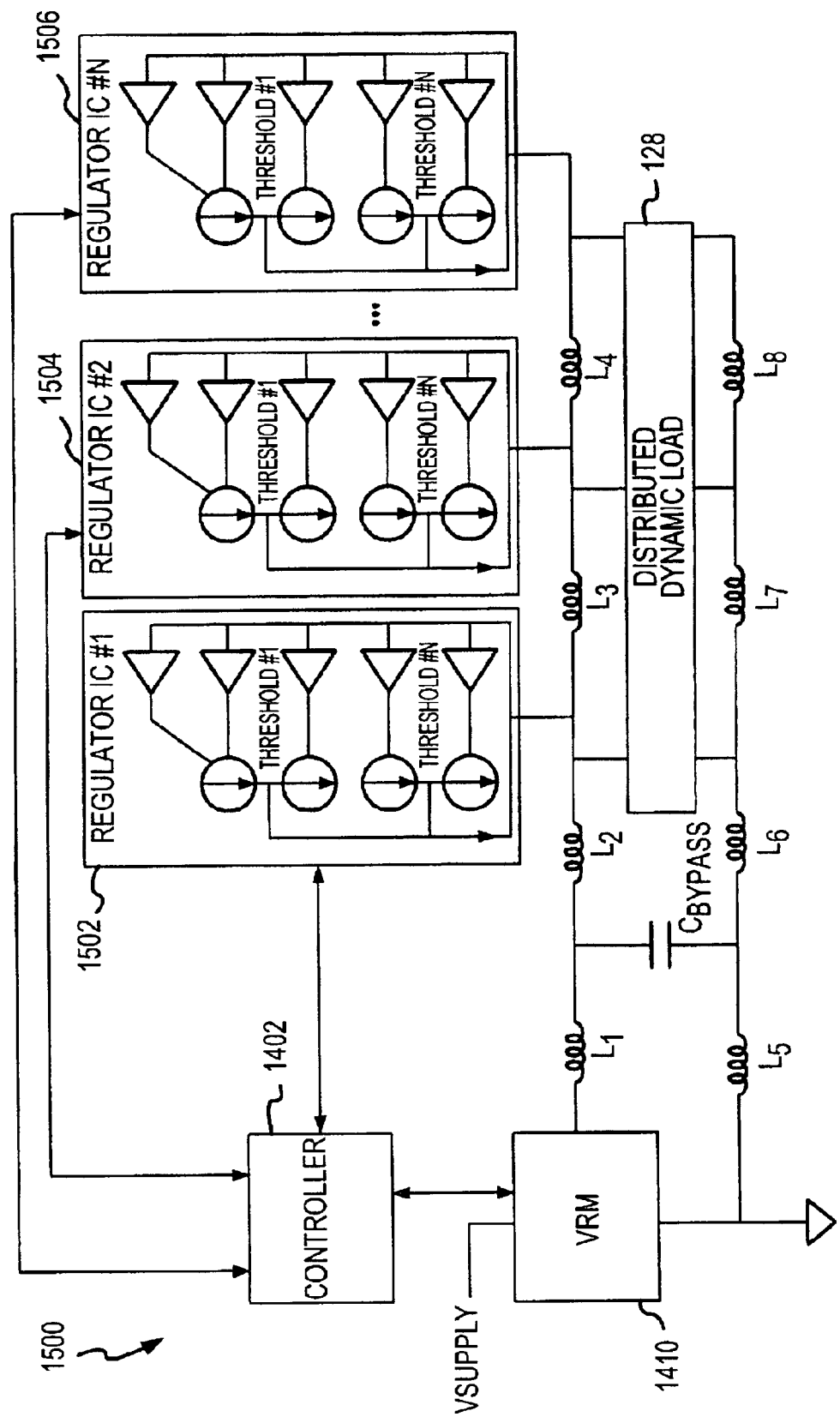

FIGS. 14 and 15 illustrate additional systems 1400 and 1500 having single and multiple threshold secondary regulators, respectively, in accordance with the present invention. Systems 1400 and 1500 each include a controller 1402 (optional), a plurality of transient suppression regulators, and a primary voltage regulator 1410, coupled to load 128, which may be the same as any of the controllers, transient suppression regulators, and primary regulators described herein.

Secondary regulators 1404–1408, illustrated in FIG. 14, are coupled to various portions of load 128 to provide spatial and temporal transient response power to the plurality of locations of the load. Regulators 1404–1408 are isolated from each other though inductance, represented as $L_3$ and $L_4$ on the power side and $L_7$ and $L_8$ on the ground side, and may be additionally isolated from each other, as described below in connection with FIG. 31.

System 1400 also includes a plurality of sense circuits 1412–1422, which may include any combination of the sense devices described above in connection with FIGS. 4 and 5. In accordance with the illustrated embodiment, each secondary regulation includes at least one and preferably two (one high side and one low side) sense circuits. System 1500 is similar to system 1400, except system 1500 includes a plurality of multiple-threshold plus di/dt regulators 1502–1506. Use of multiple-threshold with combined di/dt sensing regulators may be desirable because interactivity between the plurality of regulators may be reduced through use of multi-threshold nonlinear regulators and multi-threshold nonlinear regulators may offer improved response compared to single threshold nonlinear regulators. Furthermore, multi-threshold regulators can also readily accommodate spatial distribution of the dynamic load, increasing the current where the load change was heaviest. Such regulators can also easily accommodate simultaneous increase and decrease in different regions, and the di/dt sensing allows for more rapid detection and consequently response to transient events.

Figure 16:
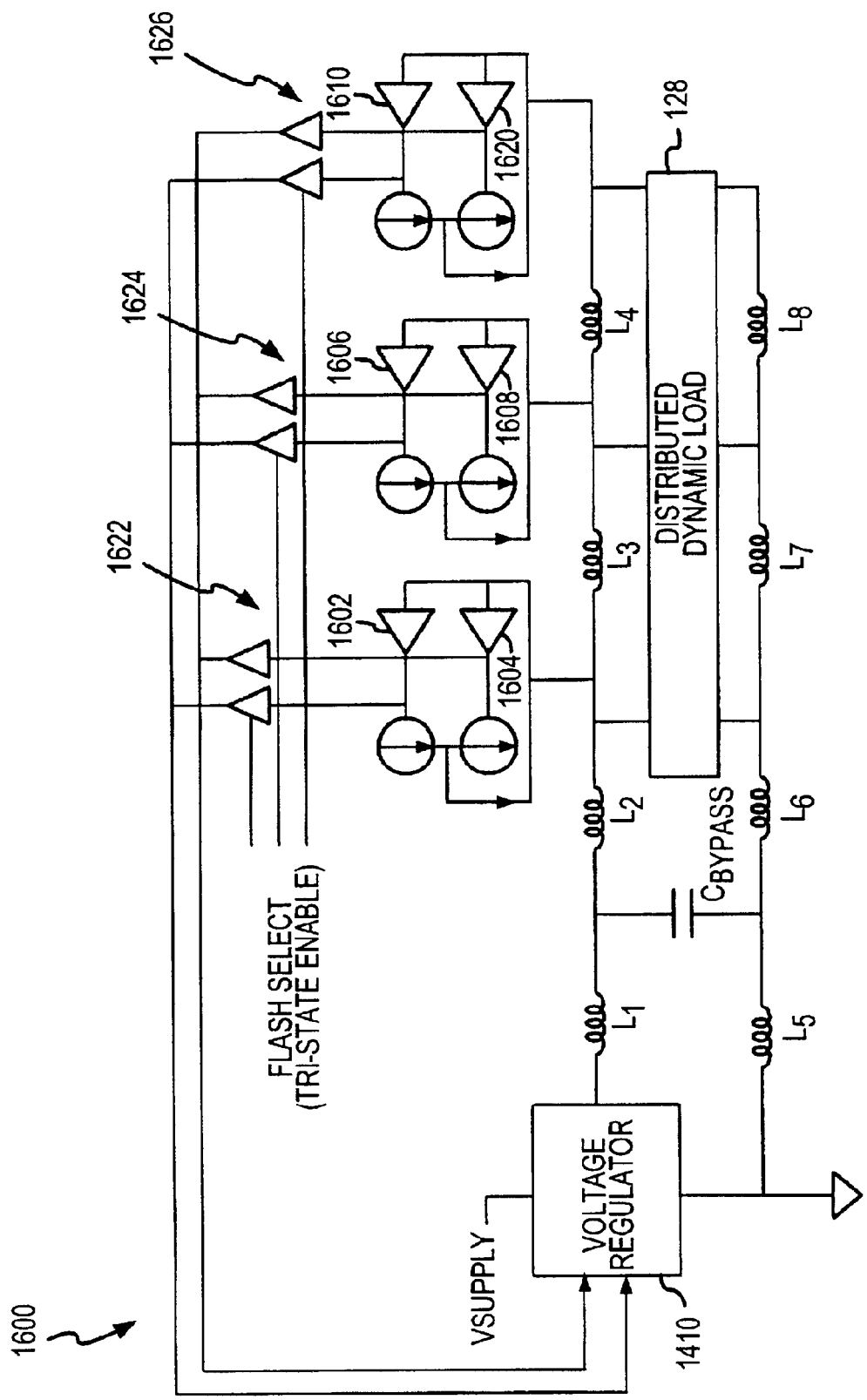

FIG. 16 illustrates another distributed regulation system 1700 in accordance with another embodiment of the invention, including a plurality of sense circuits 1602–1620 (e.g., voltage comparators) in different physical locations on or proximate load 128 and a plurality of transient response regulators 1622–1626. Transient suppression regulators in accordance with this embodiment of the invention may include any of the secondary or transient suppression regulators described herein (e.g., multiple threshold plus di/dt regulators described in connection with FIG. 15); however, regulators 1622–1626 are conveniently illustrate as single-threshold voltage regulators.

Similar to system 1300, system 1600 is configured to generate signals indicative of a transient event (high or low current) and send a signal to, in this case, primary regulator 1410 in response to the sensed transient event. In the illustrated embodiment, the transient event signal is obtained using voltage comparators and a tri-state buffer to select which comparator sends a signal to the primary regulator. In this case, only one transient suppression regulator transmits a signal, indicative of a sensed transient event, to the primary regulator. In accordance with other embodiments of the invention, signal may be alternatively transmitted to a controller as described above in connection with system 1300.

Figure 17:
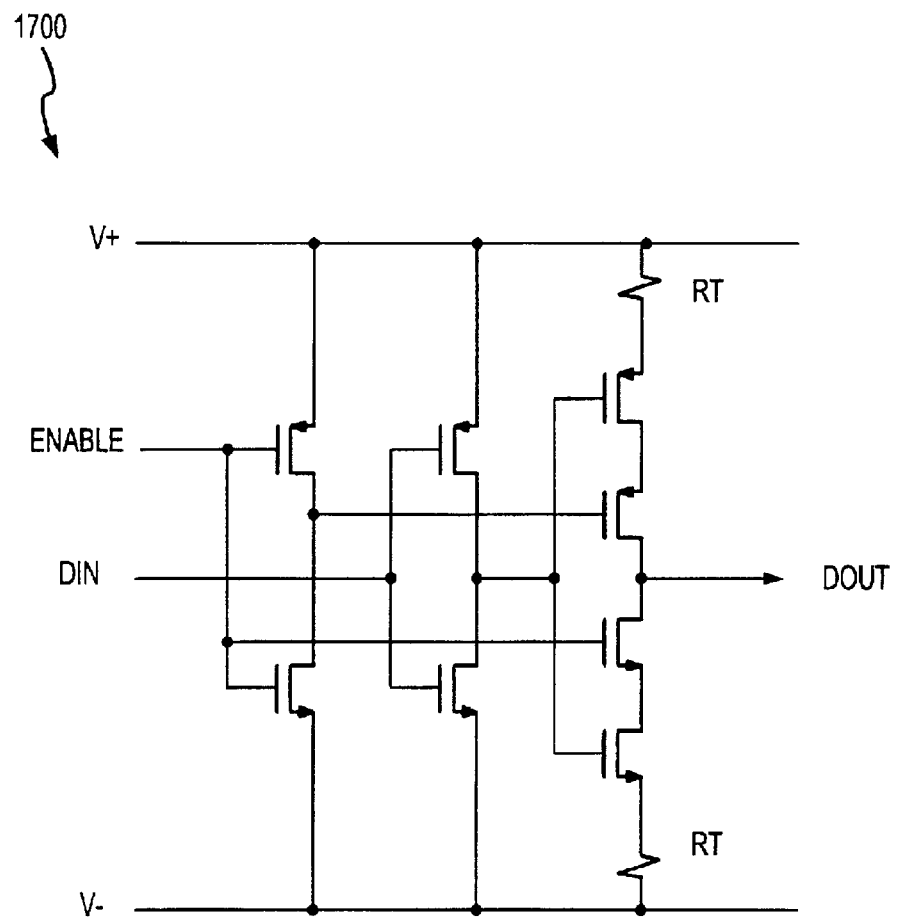
FIG. 17 illustrate an tri-state buffer in accordance with one aspect of the present invention.

FIG. 17 illustrates a high-speed tri-state buffer 1700 for use with the systems of the present invention, such as system 1600. Buffer 1700 is configured to only enable the signal which provides the desired comparison to generate the command to regulator 1410. In this manner, a comparator that is preferably located near the center of distributed load 128, or close to its most active region. This approach offers the flexibility of constructing the distributed regulator from multiple copies of a single design, while facilitating both the programmability and the implementation of a high-speed signal to the primary regulator.

Load transient event amplitude, duration, and frequency may vary widely and may depend on many factors, many of which may be unknown to a regulation system in advance of an event. A transient suppression scheme therefore may desirably include a transient response regulator with the ability to adapt, both in the short term, responding to immediate, potentially catastrophic operating conditions, as well as in the long term, to improve regulation efficiency. Adaptation can be broken down into two components: monitor and response.

The monitor function may take place by tracking key system attributes, such as temperature, charge well ($C_{store}$) voltage level, or fire count. This monitoring can be implemented via counters and/or multi-threshold level comparators or any other circuit that indicates the status of secondary regulator attributes of interest. This monitoring of key attributes allows the system to determine what action, if any, should be taken. It should be noted that the charge well refers to charge storage elements, such as capacitors, within each secondary regulator, used to provide charge for the current source function. Furthermore, fire count represents the status of counters within each secondary regulator that record the number of times various thresholds of interest have been reached as an indication of activity level.

Response generation may come in several different forms. For example, one form is governed by a controller through the periodic polling of the secondary regulator(s) within the regulation system, and another form is governed locally, when monitors indicate a condition that warrants a "panic mode." In either case, the secondary regulator(s) respond by, e.g., adjusting internal attributes such sense thresholds or the magnitude of $I_{boost}$.

Generally, the response governed by a controller will be the mechanism for responding to temperature fluctuation, charge well voltage level, matching to load mapping, and to improve general regulation efficiency. In accordance with one embodiment of the invention, when polled, each secondary regulator communicates to the controller key monitored parameters such as temperature, charge well level, or fire count. Based on this information, the controller then determines what, if any, adjustments should be made and communicates this information back to the appropriate secondary regulator. This adjustment can be made in response to, e.g., monitored thresholds, sense thresholds, $I_{boost}$ magnitude, or any other secondary regulator attribute that affects regulation performance.

If desired, the controller may have the ability to initiate a fast state switch for one or more secondary regulators. This response can be used in a situation in which the controller recognizes a pattern in the part under regulation and therefore communicates to some or all of the secondary regulators to load a defined state. This defined state may include specific monitor thresholds, sense thresholds, $I_{boost}$ magnitude, or any other attribute that affects regulation performance.

In more severe cases, a "panic mode" will take place. In this case, if a secondary regulator determines that a system attribute, such as temperature or charge well voltage has reached a critical level, the secondary regulator will initiate a response, such as sense comparator or $I_{boost}$ magnitude adjustment (without waiting for the controller to react) and indicate back to the controller that panic mode has been reached.

In accordance with one aspect of this embodiment, the "panic mode" is entered autonomously (without the assistance of a controller) when a secondary regulator determines that excessive triggering is taking place, through the monitoring of device temperature, average output current, charge well voltage, fire count, or various other indicators of activity level. When in "panic mode", the trigger sensitivity may be relaxed until the device has an opportunity to cool, replenish its charge well, or otherwise return to an acceptable operating condition. The secondary regulator may set a system flag or provide an interrupt when this mode is reached to communicate its current state to a controller or any other device.

In accordance with one embodiment of the invention, temperature monitoring of the transient suppression device may be used as an indicator of activity level and device stress. Programmable temperature thresholds allow for dynamic adaptation of device characteristics to more appropriately match the suppression characteristics to the device's thermal and electrical limits.

In accordance with another embodiment of the invention, charge-well monitoring of the transient suppression device may also be useful as an indicator of activity level and device stress. Programmable charge-well thresholds allow for dynamic adaptation of device characteristics to more appropriately match the suppression characteristics to the device's thermal and electrical limits.

Figure 18:
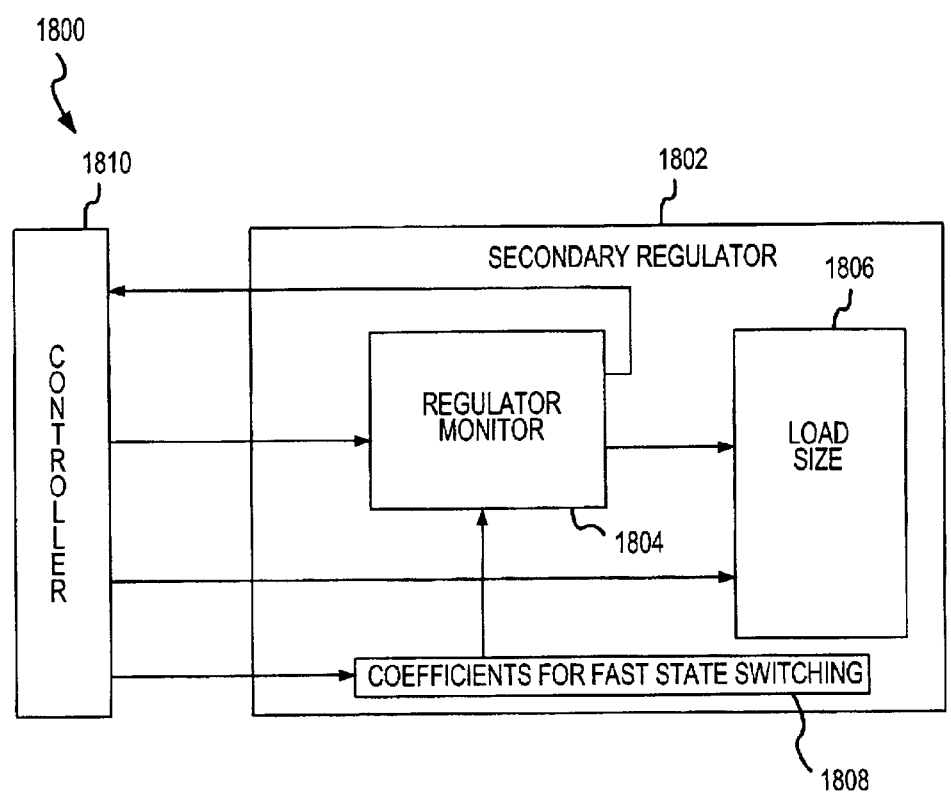

FIG. 18 illustrates a portion 1800 of a power regulation system in accordance with the present invention in which the monitoring functions within a secondary regulator 1802 are performed by regulator monitor 1804, which is coupled to load sense 1806 and fast state switching coefficients 1808. A controller 1810 is also present to control the operation of those components. It should be noted that additional secondary regulators 1802, with a similar configuration to secondary regulator 1802, may also be present. In accordance with alternative embodiments of the invention, one or more of the monitoring functions may be formed using a separate circuit, such as for example, a portion of a microprocessor.

Figure 19:
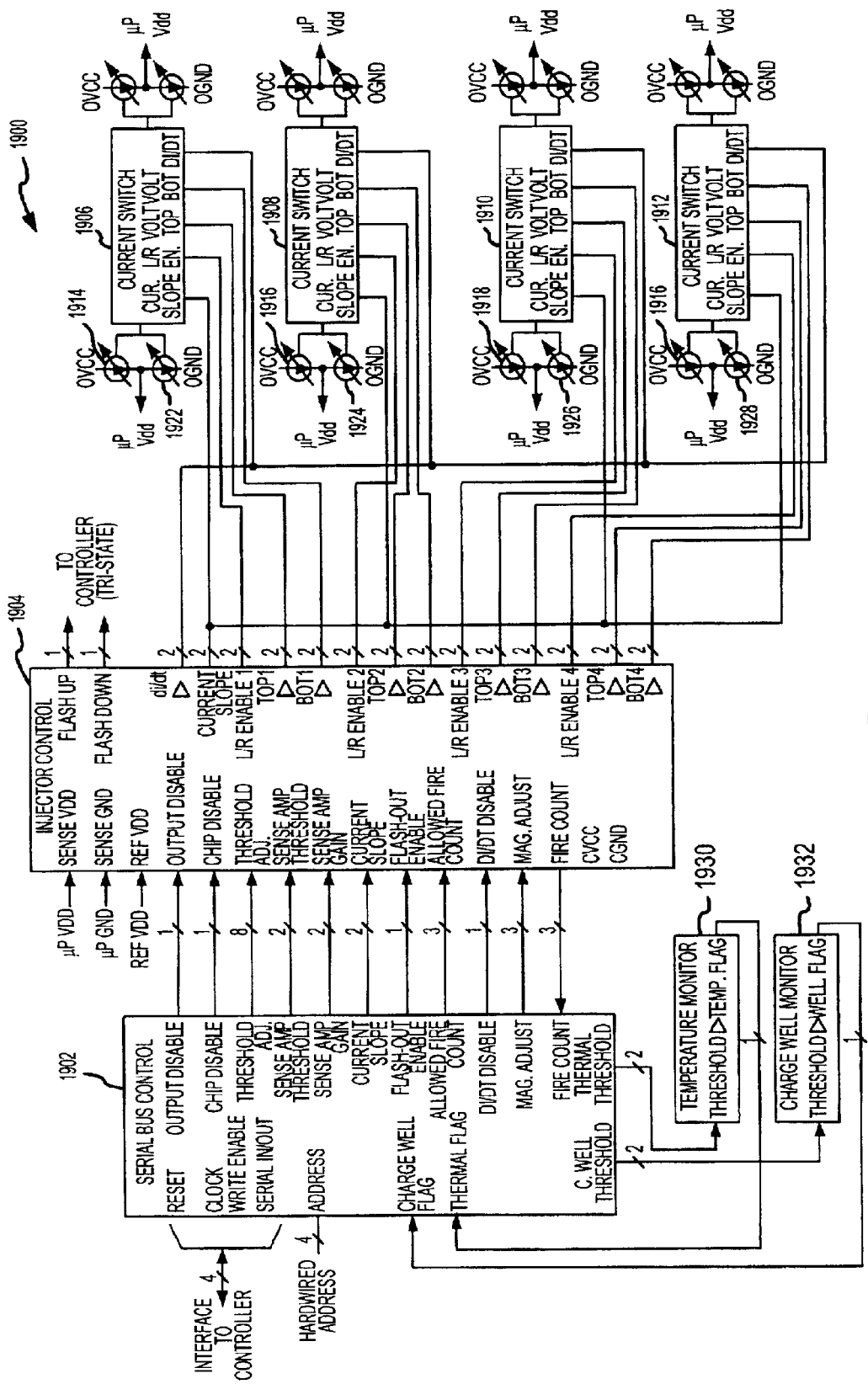

FIG. 19 illustrates an exemplary block diagram of a secondary regulator 1900, including temperature monitoring, charge well monitoring, and hand-off signal capability to allow transient response from both a primary regulator and a secondary regulator, in accordance with the present invention. Regulator 1900 includes a serial bus control portion 1902, an injector control portion, switches 1906–1912, current sources 1914–1920, current sinks 1922–1928, a temperature monitor 1930, and a charge well monitor 1932.

In accordance with one aspect of the secondary regulator illustrated in FIG. 19, di/dt sensing is only used for high-side compensation (when current is to be provided to suppress a transient event) and voltage comparison is used for both high-side and low-side compensation. The voltage comparators are preferably configured with a "dead zone", hysteretic comparators, and asymmetric thresholds that are optimized for undervoltage control as described above.

Figure 20:
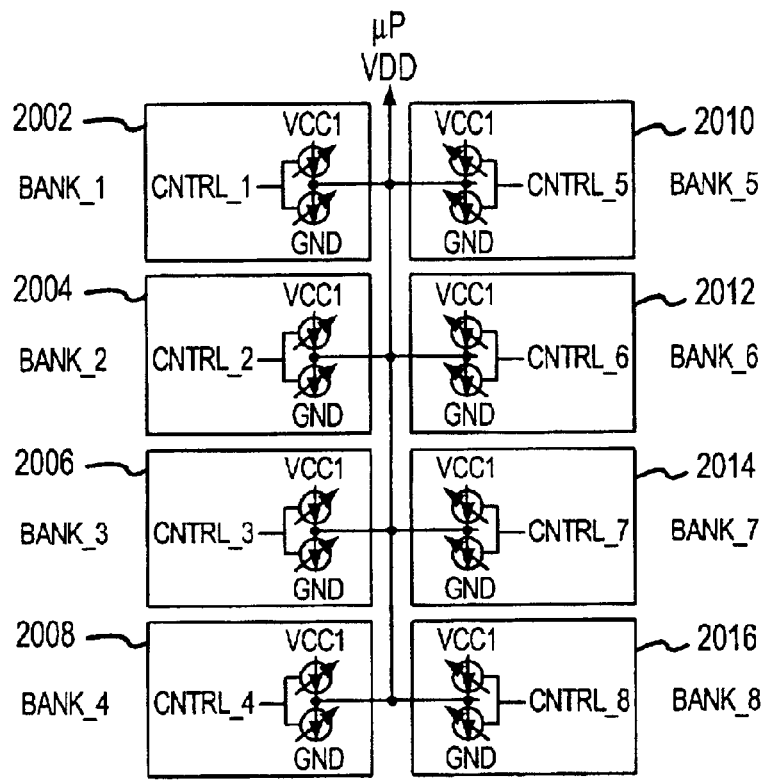

FIG. 20 illustrates another secondary or transient suppression regulator 2000 in accordance with an exemplary embodiment of the present invention. Regulator 2000 includes a plurality of output banks 2002–2016 which are separately enabled—for example, through use of a controller (described below in connection with FIG. 22). Selecting the number of output banks which are enabled in each device allows the magnitude of the response to be tailored to match the dynamic load characteristics.

Figure 21:
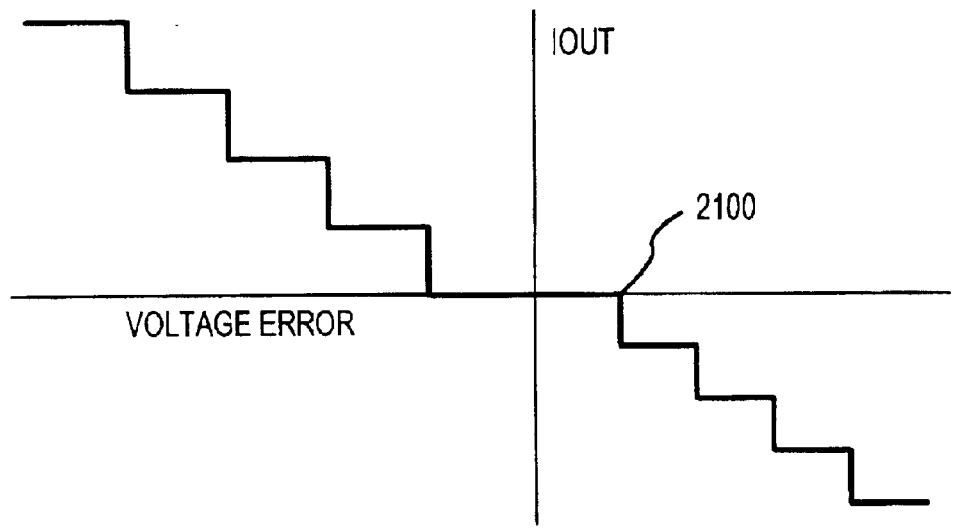
FIG. 21 illustrates an output segmentation and multiple threshold transfer function of a secondary regulator illustrated in FIG. 20 in accordance with the present invention.

An example of the transfer function 2100 of the first four banks of regulator 2000 is illustrated in FIG. 21. The thresholds at which the output current banks are activated need not be uniform or symmetric for the invention to function properly.

Figure 22:
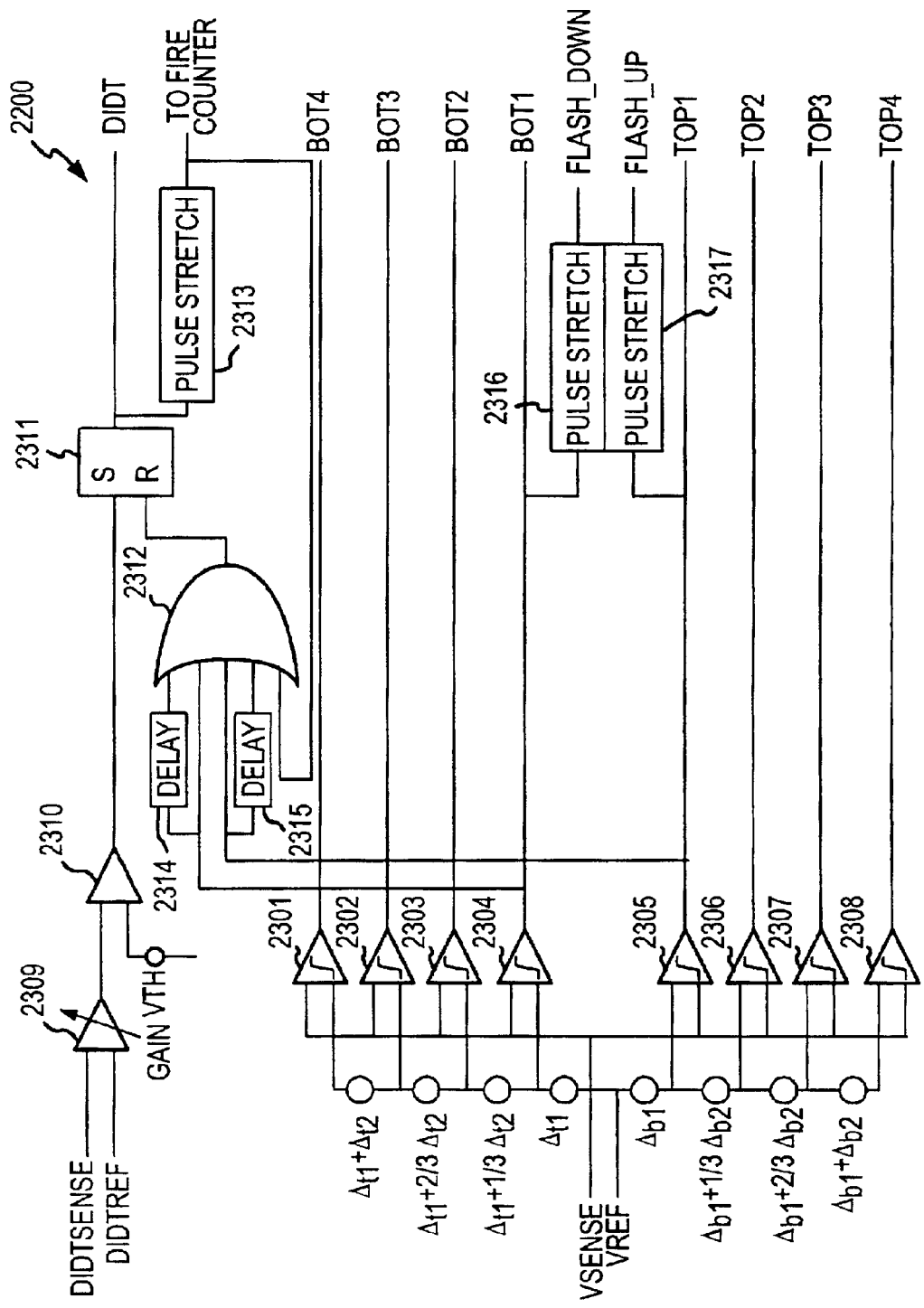
FIG. 22 illustrates an injection control logic circuit for use in a transient suppression regulator in accordance with the present invention.

FIG. 22 illustrates an injector control logic circuit 2200 for use with regulator 2000, illustrated in FIG. 20. In accordance with the illustrated circuit, compensation current provided by regulator 2000 can be determine by monitoring load voltage, di/dt transient inductance across the power supply (e.g., across the parasitic inductance) or both.

Figure 23:
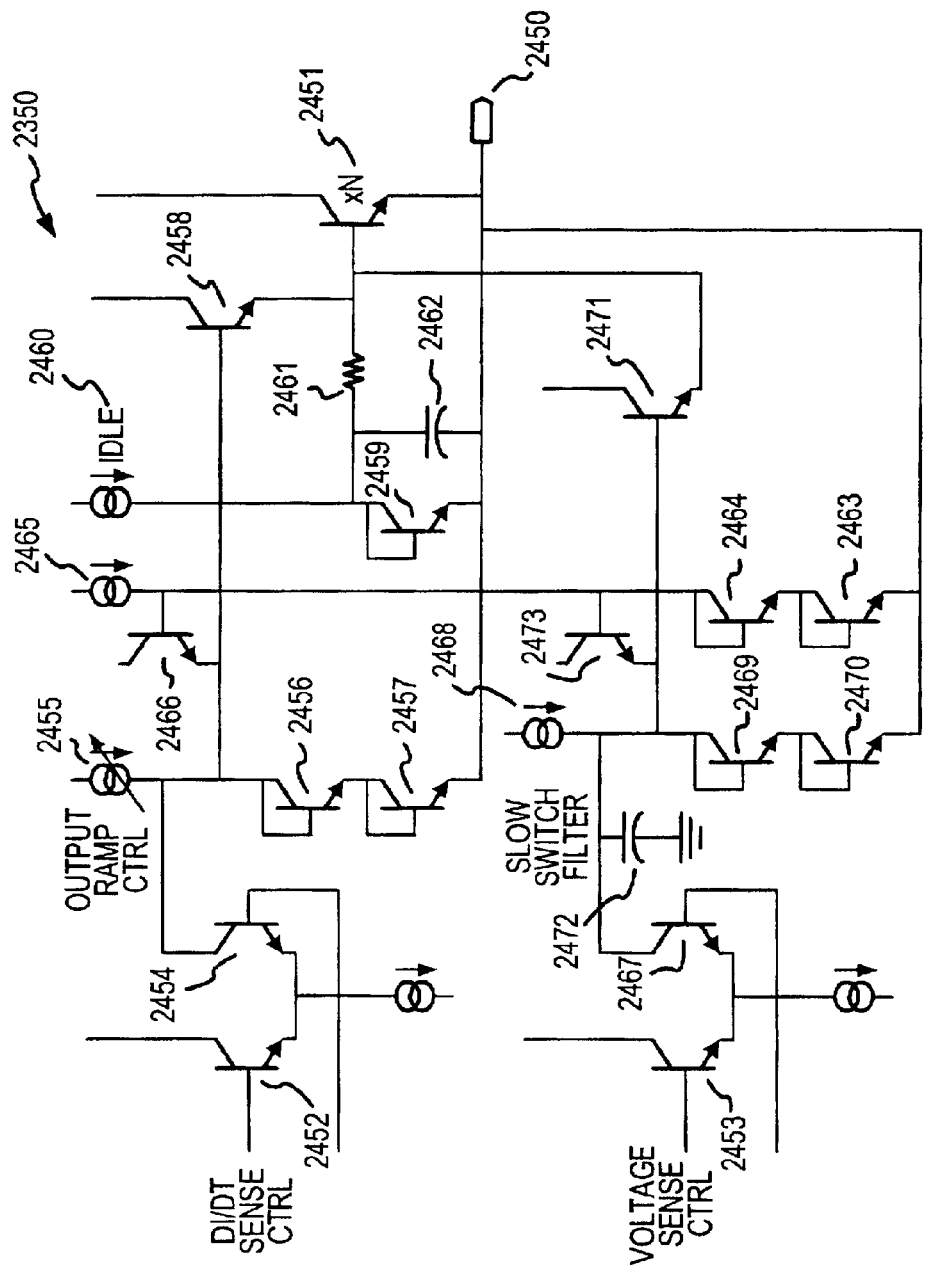
FIG. 23 illustrates a shared current switch for use with a transient suppression regulator in accordance with the present invention.

Each bank or a group of banks 2002–2016 can be activated by one or more control signals (illustrated as signals bot4, bot3, bot2, bot1, top1, top2, top3, and top4 in FIG. 22) to obtain a desired output current. FIG. 23 illustrates a shared-current switch 2300 for activating one or more of banks 2002–2016 in accordance with an exemplary embodiment of the invention.

Circuit 2200 includes comparators 2301, 2302, 2303, and 2304 configured to detect overvoltages at 4 different thresholds. The 4 outputs, bot1, bot2, bot3, and bot4 are used to drive the current sink devices in two of the output banks. Similarly, comparators 2305, 2306, 2307, and 2308 detect undervoltages at 4 different thresholds. The 4 outputs, top1, top2, top3, and top4 can each be used to drive the current source devices in two of the output banks. This allows a multiple-threshold transfer function (e.g., transfer function 2100) to be generated.

Circuit 2200 also includes amplifiers 2309 and 2310 that are used to detect a di/dt transient by sensing the voltage across the supply's parasitic inductance. The gain and offset of the amplifiers are programmed to generate the desired threshold. When the sense voltage exceeds the threshold voltage, SR latch 2311 is set and a di/dt command is sent to one or more of the output banks, generating a current pulse of desired magnitude. The current pulse lasts as long as the pulse is asserted, so a pulse stretch circuit 2313 is used to time the reset of latch 2311 according to the desired timing. This also serves to prevent the di/dt sensor from re-activating for a fixed limit of time from a prior event, to prevent over-activity of the compensation current.

In accordance with one embodiment of the invention, the di/dt sensing and the voltage sensing operate independently. In this case, it is desirable to prevent or reduce interactions between the two sensors that could otherwise lead to over activity or instability of the circuit. In accordance with one aspect of this embodiment, over activity is mitigated by detecting voltage mode activity by monitoring the two most sensitive comparators, and disabling the di/dt sensor while the voltage mode is active. The comparator outputs and their delayed versions from delays 2314 and 2315 are used to disable the SR latch through OR gate 2312.

In this manner, the logic described in FIG. 22, controls the output devices described in FIG. 20 in the manner prescribed in FIG. 23. This results in a compensation current of the shape illustrated in FIG. 24, which provides for desired compensation of current transients in the load. In accordance with one aspect of this embodiment, pulse shape 2400 provided by current source 2000 (or a collection of such sources) includes an initial current pulse region 2402 that exceeds the change in dynamic load and a second pulse region 2404 discharges over a longer time. The first region 2402 includes a first boost current 2406 which exceeds the transient current requirements, and the second region 2404 includes a second boost current 2408, which may or may not be substantially constant as illustrated, but which is less than the transient current requirement.

Figure 24:
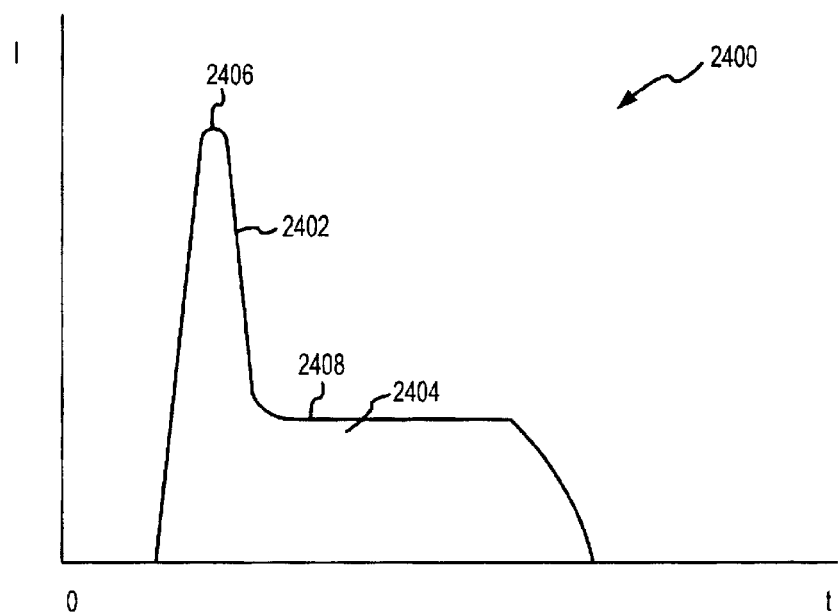
FIG. 24 illustrates an exemplary current compensation curve in accordance with the present invention.

It will be appreciated that the time scale of FIG. 24 may vary depending upon the desired application, and that the various proportions of the pulse are also merely for illustrative purposes. In one example, the delay until the first boost current is applied is about 1.0 ns and the width of the first boost (region 2402) is approximately 2 ns. The width of second region 2404 will also vary, and might be on the order of 100–200 ns.

This pulse shaping allows the initial current compensation to exceed the change in dynamic load, thus restoring the supply voltage to closer to its regulated value and providing some additional margin until the primary regulator can compensate for the change in dynamic load current. In addition, if the compensating current does not exactly match the change in dynamic load current, restoring the supply voltage to closer to the center of its range allows a greater mismatch to be tolerated.

In accordance with one embodiment of the present invention, a system such as system 100 includes circuitry wherein first region 2402 of current pulse 2400 is the result of an open-loop response to the transient current requirement (sensed, for example, via a di/dt value across a parasitic inductance), and wherein second region 2404 of current pulse 2400 is the result of a closed-loop response to the transient current requirement (sensed, for example, via the voltage across the load).

With reference again to FIG. 23, a shared current switch 2350 provides output current sourced through a large output device 2451. Device 2451 can be turned on and off from two separate control inputs. In accordance with the illustrated embodiment, a high speed path is provided from differential input 2452 and a lower speed path is provided from differential input 2453. The high speed path is controlled from the di/dt sense circuit, which is preferably optimized to work with a low or zero delay, fast transition time output device. The low speed path is controlled from a voltage sense circuit, which is preferably optimized to work with a output device with well defined transition time.

Differential pair 2454 sinks the current from source 2455, which keeps diode connected transistors 2456 and 2457 from turning on. Current source 2460 provides a minimal idle current through diode connected transistor 2459 which keeps output device 2451 at the edge of turning on. Capacitor 2462 helps to minimize the noise on the current through output device 2451. Current source 2465 provides some bias current to turn on diode-connected transistors 2463 and 2464, which allow clamp device 2466 to keep the voltage at the base of 2458 approximately one Vbe above the voltage at the output pin 2450. When the di/dt sense circuit fires, the input drives the differential pair 2454 such that the current through source 2455 turns on device 2458, which provides current gain and drives output device 2451. Resistor 2461 provides isolation from filter capacitor 2462. This allows a very fast, high slew rate output current to be generated from the signal at input 2452.

Similarly, differential pair 2467 sinks the current from source 2468, which keeps diode connected transistors 2469 and 2470 from turning on. Clamp device 2473 keeps the voltage at the base of 2471 approximately one Vbe above the voltage at the output pin 2450. When the voltage comparator fires, the input drives the differential pair 2467 such that the current through source 2468 turns on device 2471, which provides current gain and drives output device 2451. Capacitor 2472 controls the transition time under this mode of operation. This allows a slower transition in the output current to be generated from the signal at input 2453.

Note also that device 2451 constitutes a significant area of the entire circuit, since it is responsible for carrying most of the output current. In this manner, combining the di/dt sense and voltage control logic while sharing the output device allows the output switch performance to be optimized without incurring a significant increase in die area.

Figure 25:
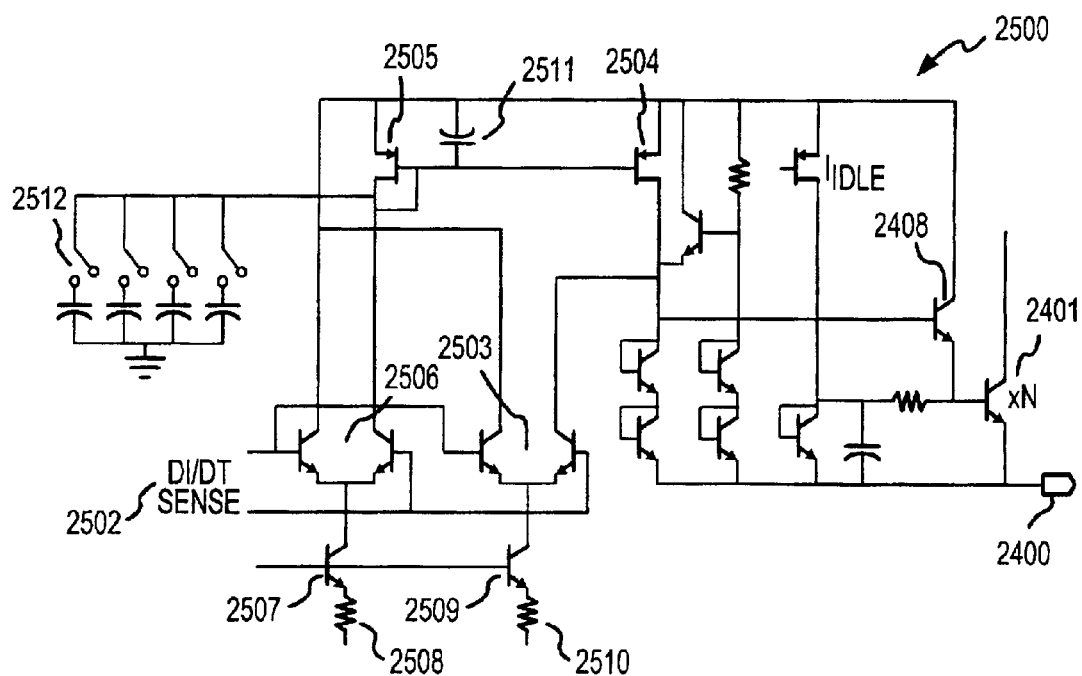
FIG. 25 illustrates a current switch output ramp control circuit in accordance with the present invention.
Figure 26:
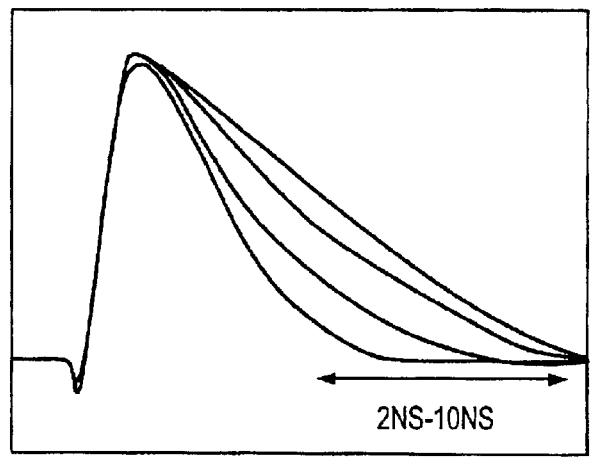
FIG. 26 illustrates current pulse generated using the circuit of FIG. 25.

Current Source 2455 can be controlled for improved shaping of the output current through the circuit 2500, illustrated in FIG. 25. Circuit 2500 is configured to generate a very fast slew rate output current pulse, with programmable duration and fall time to deliver a desirable amount of charge to the load. FIG. 26 illustrate various exemplary waveform shapes where the duration and fall time are optimized for a given load.

Circuit 2350 can be modified by implementing current source 2455 as follows. PFET 2504 provides the nominal DC current of source 2455. The current is set through reference current sink set by NPN 2507 and degeneration 2508, then mirrored through PFET 2505. When the input 2502 is switched, the current through 2504 is allowed to flow through NPN 245, which turns on output device 2451. Simultaneously, differential pair 2506 is switched, which turns off the current in PFET mirror 2505. The voltage at the gate is sustained by capacitor 2511, such that current through 2504 continues to flow until capacitor 2511 is discharged. This limits the amount of current flowing through 2504, turning off the current through output device 2451. By modifying the capacitance at the gate of PFET 2505 through the programmable capacitor array 2512, the output current through output device 2451 can be modified accordingly.

Referring again to FIG. 22, the output of the most sensitive comparators, 2304 and 2305, can be used as an activity indicator (ATR or "flash" command) for a primary regulator (e.g., regulator 102). The comparator outputs are useful as a signal to inform the primary regulator that the secondary regulator is active, and whether the load has generated a dynamic increase or decrease in current. Use of a command to the primary regulator from the secondary regulator reduces the transient event response time of the primary regulator, reducing the thermal load and charge well depletion of the secondary regulator. Pulse stretch circuits 2316 and 2317 are used to filter these signals to limit the high frequency content in the interface.

Figure 27:
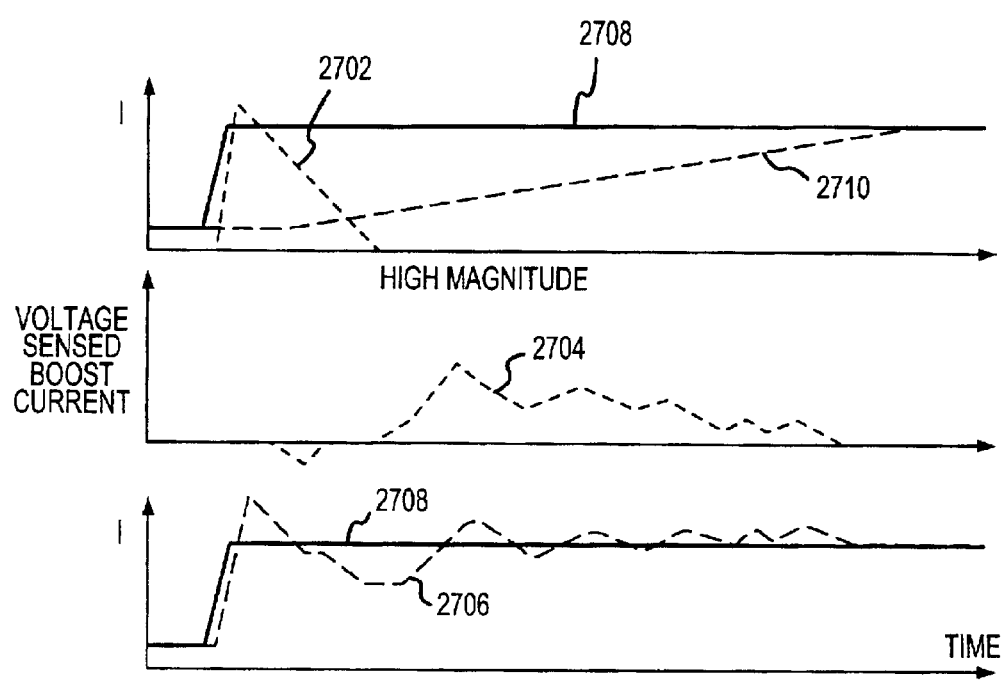
FIGS. 27 and 28 illustrate current compensation curves using the power system of the present invention.
Figure 28:
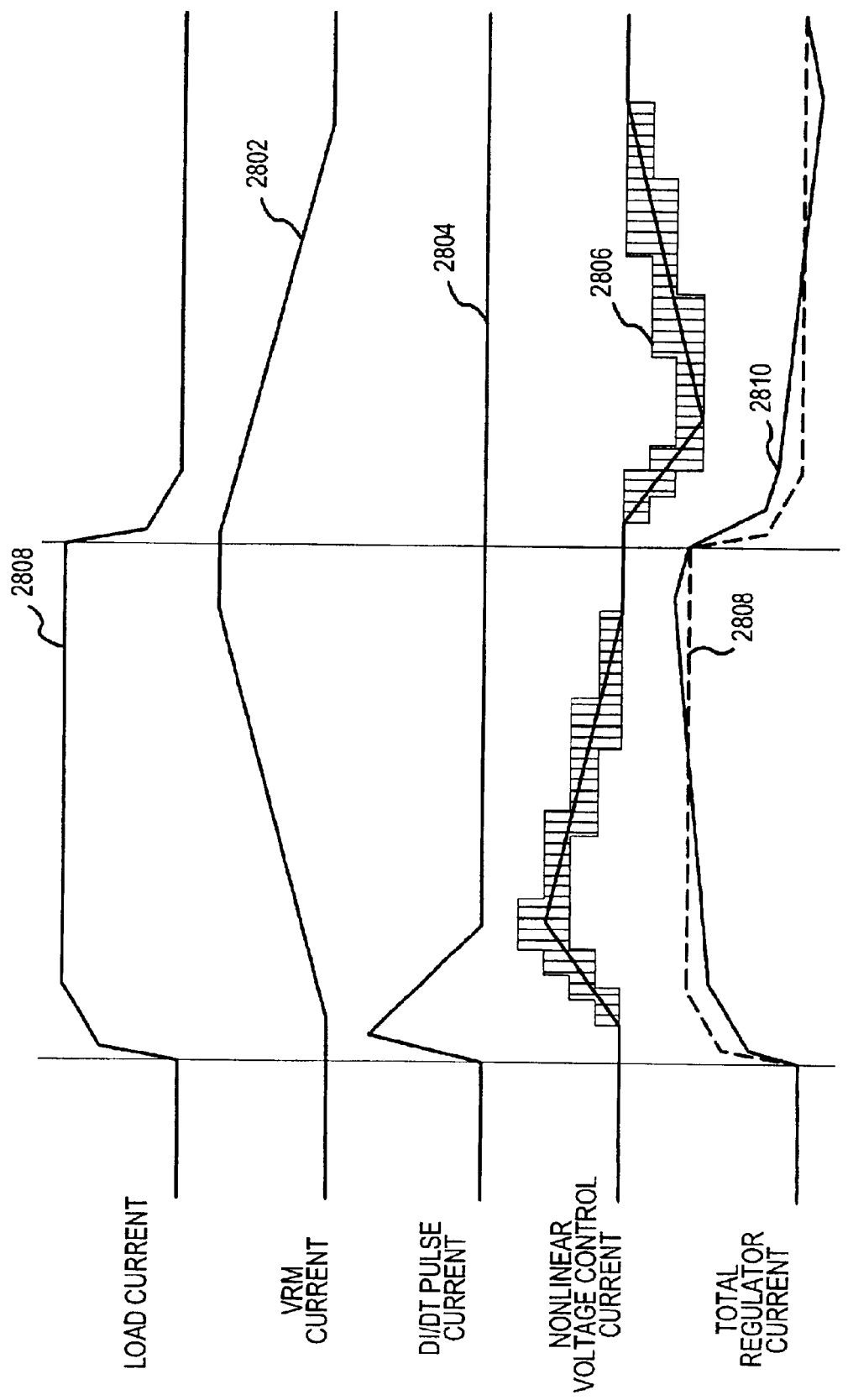

FIGS. 27 and 28 illustrate operation of a power regulation system such as system 100 in accordance with the present invention. In particular, FIG. 27 illustrates the result of combining a high magnitude di/dt boost current 2702 with a voltage-sensed boost current 2704. As shown, the total supply current 2706 momentarily overshoots load current 2708 before settling into a steady-state value which corresponds to the sum of the di/dt boost current 2702, the voltage sense boost current 2704, and the primary regulator current 2710. In many applications, however, this overboosting of voltage is not a great concern provided that the reliability of the devices making up the load are not compromised. Underboosting of voltage, however, may cause bit errors. Therefore, a preferred embodiment of the present invention allows the di/dt-sensed is boost current to have a magnitude which is between about 70% and 100% of the maximum delta current the load may draw, and a voltage-sensed boost current which corresponds to the instantaneous dynamic load current minus the primary regulator current. The actual magnitude of the boost current may be proportional to the expected transient amplitude, or may be calculated based on any convenient criterion.

The di/dt-sensed regulation described above is capable of controlling the very high frequency responses. However, an error output voltage dV may still exist. In a preferred embodiment of the present invention, the handoff system is configured such that the shutoff rate of the di/dt sensed boost current matches that of the turn-on rate of the primary regulator, thus providing a more optimal response and reducing the error voltage dV. This hand-off system can also be accomplished by implementing a handoff system with a voltage-sensed boost current in the secondary nonlinear regulator as shown in FIG. 16.

FIG. 28 illustrates another example of combining primary regulator current 2802 with a di/dt current pulse 2804 and a non-linear voltage control current pulse 2806, which may be generated by a power regulation system (e.g., system ___) in accordance with the present invention. In this case, the total current 2810 supplied by the power system does not initially overshoot load current 2808.

Figure 29:
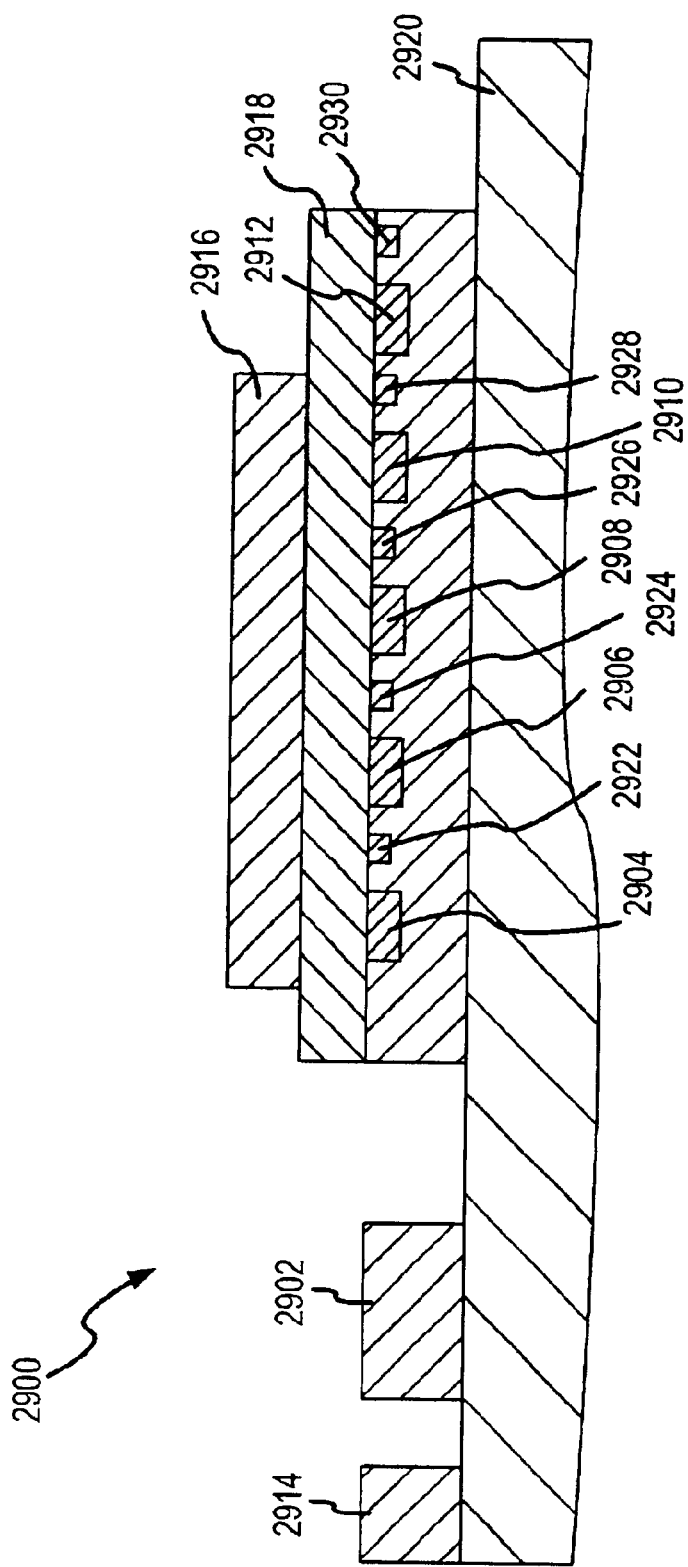
Figure 30:
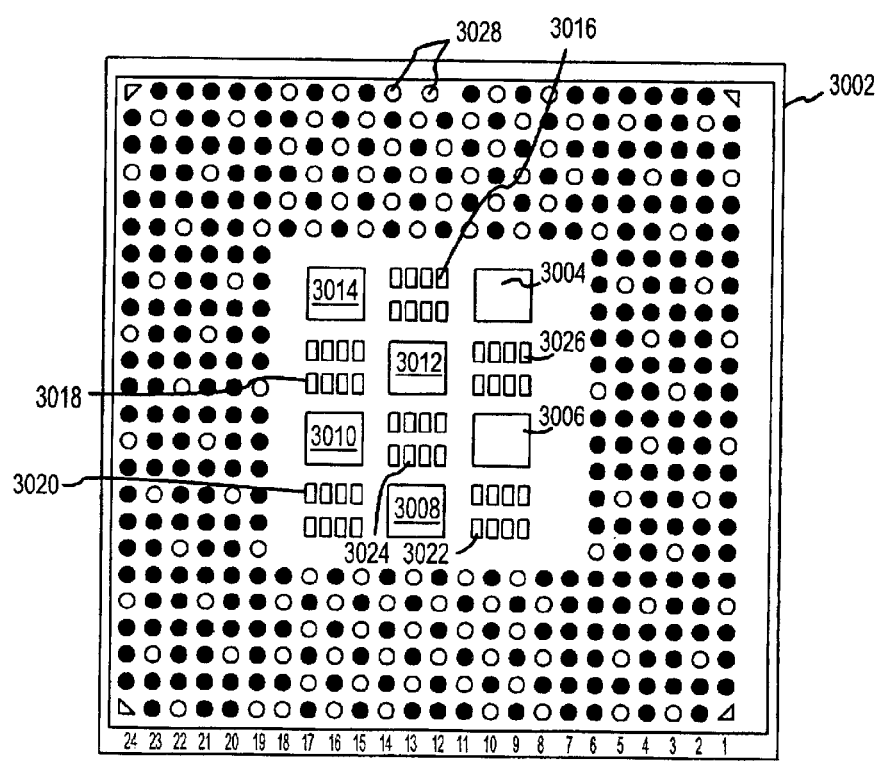

FIGS. 29 and 30 schematically illustrate exemplary layouts for power regulation systems such as system 100. System 2900 includes a primary regulator 2902, a plurality of transient suppression regulators 2904–2912, and a controller 2914 coupled to a microprocessor 2916. In accordance with the exemplary illustrated embodiment, transient suppression regulators 2904–2912 are coupled (e.g., using bump technology) to a substrate 2918 such multi-layered fire-resistant printed circuit board, to which microprocessor 2916 is also coupled (e.g., using bump technology), and optionally includes decoupling capacitors 2922–2930 to further assist with power regulation. In accordance with other embodiments of the invention, regulators 2904–2912 may be attached to the microprocessor using Bumpless Build-Up Layer (BBUL) technology. In accordance with yet another embodiment of the invention, regulators 2902 and 2904–2912 may be packaged together and coupled either directly or indirectly to the microprocessor.

In further accordance with embodiment illustrated in FIG. 29, primary regulator 2902 is coupled to a second substrate 2920 such as another printed circuit board (e.g., a mother board of a computer system) and is coupled to microprocessor 2916 and to at least one of regulators 2904–2912. Alternatively, regulators 2904–2912 may be coupled to another power source. Forming or attaching regulator 2902 to a second substrate may be advantageous because any heat generated by the regulator may be more easily dissipated and is less likely to affect performance of microprocessor 2916.

Although illustrated as a separate component, controller 2914 may suitably be integrated with any of microprocessor 2916, secondary regulators 2904–2912, or primary regulator 2902. In accordance with one exemplary embodiment of the invention, controller 2914 is a discrete circuit coupled to primary regulator 2902 and a sense circuit (not illustrated, which may be formed as part of any of regulators 2904–2912 as described above) and/or to microprocessor 2914 using conductive layers on or within substrate 2920.

Figure 32:
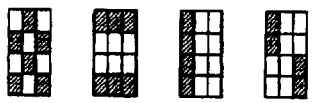
FIG. 32 illustrates various exemplary configurations for capacitors and secondary regulators in accordance with the present invention.

FIG. 30 illustrates a bottom portion of a substrate 3002 including multiple transient suppression regulators 3004–3012 and multiple capacitor banks 3016–3026, and conductive bumps 3028. Other configurations are also within the scope of the invention, and may depend on such factors as amount of current typically required to regulate transient power demands for a particular portion of the microprocessor, duration of a typical transient event for the portion of the microprocessor, and the like. FIG. 32 illustrates various exemplary configurations for capacitors and secondary regulators in accordance with the present invention.

Figure 31:
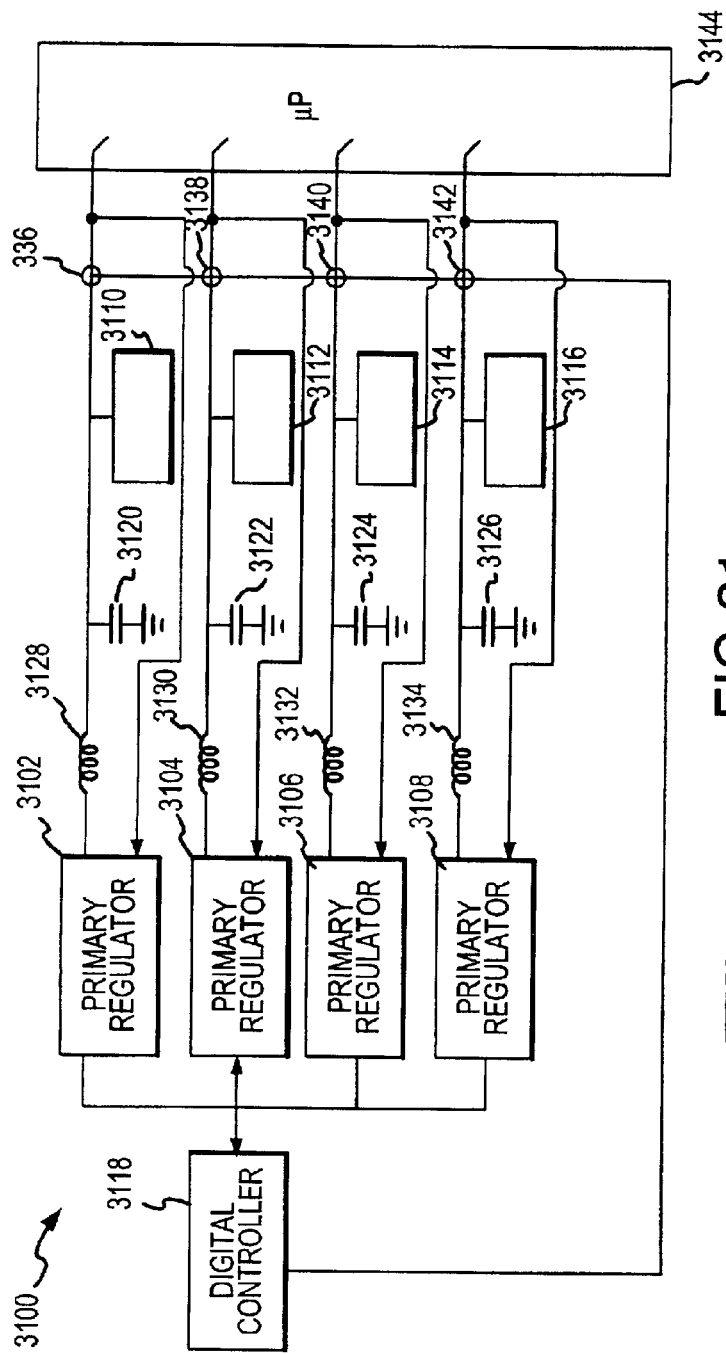

FIG. 31 illustrates a power regulation system 3100 in accordance with another exemplary embodiment of the invention. System 3100 includes primary regulators 3102–3108, transient suppression regulators 3110–3116, a controller 3118, capacitors 3120–3126, inductors 3128–3134, and sense circuits 3136–3142, coupled to a microprocessor 3144. System 3100 is similar to system 100, except system 3100 is configured to supply independently controlled operating power to a plurality of locations on microprocessor 3144 or another microelectronic device. In accordance with various aspects of this embodiment, each primary regulator 3102–3108 is configured to provide independently controlled power to an independent or isolated portion of microprocessor 3144. An independent portion of microprocessor 3144 may include, for example, a group of related processor units for power delivery purposes (e.g., floating point unit memory unit, input/output unit, or the like) separated from other units or portions using suitable dielectric material and power grid formation techniques. Alternatively or in addition to providing power to various units of the microprocessor, the microprocessor may be divided into spatial portions, and power may be independently supplied to the spatial portions of the microprocessor using a plurality of regulators 3102–3108. By providing power to various units and/or portions of the microprocessor, system 3100 is able to quickly respond to changes in power demands, e.g., to transient events, and system 3100 may be configured to tailor supplied power according to the operation of portions and/or units of the microprocessor, rather than supplying one operating voltage to the entire microprocessor. In addition, each regulator 3102–3108 may be independently powered up or down, depending on operating conditions of a portion of the microprocessor, rather than based on operating conditions of the entire microprocessor.

Power regulators 3102–3108 may be configured as any of regulators 102–108 described above. In accordance with one embodiment of the invention, regulators 3102–3108 are switching regulators and at least one of regulators 3102 is a multi-phase switching regulator. In accordance with one aspect of this embodiment, one or more regulators 3102–3108 are configured such that the output of at least one of the regulators differs from the output of other regulators, such that power supplied to one portion of microprocessor 3144 differs from power supplied to another portion of the microprocessor.

Similarly, transient suppression regulators 3110–3116 may include any combination of the transient suppression regulators (e.g., regulators 110–114) described above in connection with FIG. 1. In accordance with one embodiment of the invention, each regulator 3102–3108 is coupled in parallel with a corresponding transient regulator 3110–3116. However, in accordance with other embodiments of the invention, one or more regulators 3102–3108 may not be coupled to a transient suppression regulator and one or more regulators 3102–3108 may be coupled, in parallel, to a plurality of other transient regulators. In accordance with other embodiments of the invention, one or more transient suppression regulators may be powered by yet another power source such as an unregulated power supply (e.g., an alternating current/direct current converter).

Sense circuits 3136–3142 may comprise any one or more of the sense circuits described above in connection with the sense circuits illustrated in FIGS. 4 and 5. In accordance with one exemplary embodiment, at least one sense circuit 3136–3142 includes a di/dt sense circuit configured to quickly detect a transient event and send a corresponding signal to one or more transient suppression regulator 3110–3116 and optionally to controller 3118. Although illustrated with four sense circuits, power regulation systems in accordance with the present invention may include any desired number and any desired combination of configurations of sense circuits. For example, a system may include only one sense circuit that communicates with a plurality of transient suppression regulators and optionally to a controller.

In accordance with an alternate embodiment of the invention, microprocessor 3144 may be configured to supply a predictive signal indicative of occurrence of a likely transient event. A microelectronic device and system including a device with a predictive signal generator is described in detail in application Ser. No. 10/104,227, entitled METHOD, APPARATUS & SYSTEM FOR PREDICTIVE POWER REGULATION TO A MICROELECTRONIC CIRCUIT and filed Mar. 21, 2002, the contents of which are hereby incorporated by reference.

Similar to controller 116, controller 3110 is generally configured to drive one or more regulators 3102–3108. Further, controller 3110 may be configured to receive a signal from one or more sense circuits 3136–3142 and send a corresponding signal to one or more primary regulators 3102–3108 to cause one or more of the regulators to temporarily alter an operating condition in response to the sensed transient event. Controller 3118 may be further configured to power up, power down, or alter operating parameters such as duty cycle and the like of one or more regulators 3102–3108 in response to a sensed operating conditions or other suitable signal.

It should be appreciated that the particular implementations shown and described herein are illustrative of various embodiments of the invention including its best mode, and are not intended to limit the scope of the present invention in any way. Indeed, for the sake of brevity, conventional techniques for signal processing, data transmission, signaling, and network control, and other functional aspects of the systems (and components of the individual operating components of the systems) may not be described in detail herein. Furthermore, the connecting lines shown in the various figures contained herein are intended to represent exemplary functional relationships and/or physical couplings between the various elements. Many alternative or additional functional relationships or physical connections may be present in the power regulation systems of the present invention.

The present invention has been described above with reference to exemplary embodiments. Those skilled in the art having read this disclosure will recognize that changes and modifications may be made to the embodiments without departing from the scope of the present invention. For instance, the present invention has been described in connection with coupling various components to printed circuit board substrates; however various other substrates and packages may be used to couple the components. These and other changes or modifications are intended to be included within the scope of the present invention, as expressed in the following claims.

We claim:

1. A tiered power regulation system for providing power to a microelectronic device, the system comprising:
   a first power regulator configured to provide nominal operating power to a plurality of locations on a microelectronic device and to respond to low frequency transient power demand by the microelectronic device; and
   a plurality of second power regulators configured to provide transient suppression power to the microelectronic device, wherein at least one of the second regulators is coupled in parallel to the first power regulators; and
   a sense circuit configured to detect a transient power event and coupled to at least one of the plurality of second power regulators.

2. The tiered power regulation system of claim 1, wherein the sense circuit includes a multi-threshold voltage sense circuit.

3. The tiered power regulation system of claim 1, wherein the sense circuit comprises di/dt sense circuit.

4. The tiered power regulation system of claim 1, wherein the sense circuit comprises di/dt sense circuit and a voltage sense circuit.

5. The tiered power regulation system of claim 4, wherein the voltage sense circuit comprises a multi-threshold sense circuit.

6. The tiered power regulation system of claim 1, wherein the sense circuit comprises voltage sense circuit configured to measure a voltage between Vdd and a microelectronic device power plane.

7. The tiered power regulation system of claim 1, wherein the sense circuit comprises voltage sense circuit configured to measure a voltage between an output of one of the plurality of second power regulators and a microelectronic device power plane.

8. The tiered power regulation system of claim 1, wherein the sense circuit comprises voltage sense circuit configured to compare a sensed voltage to a reference voltage.

9. The tiered power regulation system of claim 1, wherein the sense circuit comprises voltage sense circuit configured to compare a sensed voltage to a filtered sensed voltage.

10. The tiered power regulation system of claim 1, wherein the sense circuit comprises voltage sense circuit configured to measure a voltage between an output of one of the plurality of second power regulators and a microelectronic device power plane.

11. The tiered power regulation system of claim 1, wherein the sense circuit comprises di/dt circuit configured to measure a rate of change of current drawn by a microelectronic device.

12. The tiered power regulation system of claim 1, wherein the sense circuit comprises di/dt circuit configured to measure a rate of change of current by measuring a voltage cross a parasitic inductance in a microelectronic device power plane.

13. The tiered power regulation system of claim 1, wherein the sense circuit comprises di/dt circuit configured to measure a rate of change of current by measuring a voltage cross a parasitic inductance in a microelectronic device ground plane.

14. The tiered power regulation system of claim 1, wherein the sense circuit comprises di/dt circuit configured to measure a rate of change of current by measuring a voltage a cross a parasitic inductance in a microelectronic device power plane plus a voltage across a parasitic inductance in a microelectronic device ground plane.

15. The tiered power regulation system of claim 1, further comprising a controller coupled to at least one of the plurality of first power regulators.

16. The tiered power regulation system of claim 15, wherein the controller is configured to receive a signal indicative of a transient power event and to send a signal indicative of the sensed transient event to the first power regulator.

17. The tiered power regulation system of claim 16, wherein the signal indicative of a transient power event is generated from a voltage comparator with an offset from a reference voltage.

18. The tiered power regulation system of claim 16, wherein the signal indicative of a transient power event is generated from a voltage comparator with an offset from a filtered sense voltage.

19. The tiered power regulation system of claim 1, wherein at least one of the plurality of second power regulators comprises a charge well monitor.

20. The tiered power regulation system of claim 1, wherein at least one of the plurality of second power regulators comprises a temperature monitor.

21. The tiered power regulation system of claim 1, wherein at least one of the plurality of second power regulators comprises a controller configured to monitor a device characteristic selected from the group consisting of charge well and temperature and the at least one of the plurality of second power regulators is configured to modify threshold levels in response to the monitored characteristic and reduce the at least one of the plurality of second power regulators activity level when the monitored characteristic exceeds a predetermined value.

22. The tiered power regulation system of claim 1, wherein at least one of the plurality of second power regulators comprises a serial interface to allow for configuration of the regulator.

23. The tiered power regulation system of claim 1, wherein at least one of the plurality of second power regulators comprises an injector control circuit.

24. The tiered power regulation system of claim 1, wherein at least one of the plurality of second power regulators comprises a di/dt sense circuit and a voltage sense circuit for a current supply portion of the second power regulator and comprises a voltage sense circuit for the current sink portion of the second power regulator.

25. The tiered power regulation system of claim 1, wherein at least one of the plurality of second power regulators comprises a plurality of separately enabled output banks.

26. The tiered power regulation system of claim 25, wherein at least one of the plurality of second power regulators further comprises a shared current switch coupled to one or more of the banks and configured to activate one or more of the banks.

27. The tiered power regulation system of claim 25, wherein at least one of the plurality of second power regulators further comprises a di/dt current switch to generate a desired output current.

28. The tiered power regulation system of claim 1, wherein at least one of the plurality of second power regulators is configured to generate an output current pulse having a shape characterized by a first region and a subsequent second region, wherein the first region includes a first boost current which exceeds a transient current requirement, and wherein the second region includes a second boost current whose amplitude is less than the transient current requirement.

29. The tiered power regulation system of claim 1, wherein the first power regulator comprises a multi-phase switching regulator.

30. The tiered power regulation system of claim 1, further comprising a plurality of first power regulators.

31. The tiered power regulation system of claim 1, wherein at least one of the plurality of second power regulators comprises an open loop transient suppression portion.

32. The tiered power regulation system of claim 1, wherein at least one of the plurality of second power regulators comprises a closed loop transient suppression portion.

33. The tiered power regulation system of claim 1, wherein at least one of the plurality of second power regulators comprises a combination of an open loop transient suppression portion and a closed loop transient suppression portion.

34. The tiered power regulation system of claim 1, further comprising a plurality of capacitors coupled to the microelectronic device to provide additional compensation or transient power events.

35. The tiered power regulation system of claim 1, wherein at least one of the plurality of second power regulators is configured to generate a signal indicative of a transient power event and configured to transmit the signal to the first power regulator.

36. The tiered power regulation system of claim 35, wherein at least one of the plurality of second power regulators comprises a plurality of voltage comparators and a tri-state buffer switch to enable only one of the plurality of voltage comparators to send the signal to the primary regulator.

37. The tiered power regulation system of claim 1, wherein at least one of the plurality of second power regulators is configured to adapt to operating conditions.

38. The tiered power regulation system of claim 1, wherein at least one of the plurality of second power regulators is configured to monitor operating conditions.

39. A microelectronic power regulation system comprising:
a primary power regulator configured to provide nominal operating power to a microelectronic device and to respond to low frequency transient events; and
a plurality of second regulators coupled to the microelectronic device, wherein at least one of the second regulators comprises a voltage sense circuit and a di/dt sense circuit.

40. The microelectronic power regulation system of claim 39, further comprising a plurality of primary power regulators configured to provide independently controlled power to a plurality of portions of a microelectronic device.

41. A microelectronic power regulation system comprising:
a first power regulator mechanically coupled to a first substrate and electrically coupled to a microelectronic device; and
a plurality of second regulators mechanically coupled to a second substrate, the second substrate mechanically coupled to the first substrate, wherein at least one of the plurality of second regulators comprises a voltage comparator to detect a transient power event.

42. The microelectronic power regulation system of claim 41, wherein the plurality of second regulators are configured to provide transient suppression power to a plurality of locations on a microelectronic device.

43. The microelectronic power regulation system of claim 41, wherein the plurality of second regulators are coupled to a bottom portion of the microelectronic device.

44. The microelectronic power regulation system of claim 41, wherein at least one of the plurality of second regulators comprises a di/dt sense circuit.

45. The microelectronic power regulation system of claim 41, further comprising a low pass filter coupled to the voltage comparator.

46. A power regulation system for providing regulated voltage to a variable load during steady state and transient load periods, the system comprising:
- a primary regular configured to detect a transient event;
- a controller coupled to the primary regulator and configured to receive an early transient event detection signal, to control the primary regulator during quiescent voltage regulation, and to control the primary regulator during a transient response mode; wherein the transient mode response is initiated upon receipt of the early transient event detection signal; and
- a plurality of second power regulators, wherein at least one second power regulator is configured to detect the transient event, to provide an early transient event detection signal to the controller, and to directly respond to the transient event by sourcing current to the load when the load increases and sinking current from the load to a ground when the load decreases.

47. The power regulation system of claim 46, wherein at least one of the second power regulators comprises a di/dt sense circuit.

48. The power regulation system of claim 46, wherein at least one of the second power regulators comprises a voltage sense circuit.

49. The power regulation system of claim 46, wherein at least one of the second power regulators comprises a di/dt sense circuit and a voltage sense circuit.

50. The power regulation system of claim 46, wherein the di/dt sense circuit and the voltage sense circuit are coupled to a common current source.

51. The power regulation system of claim 46, wherein at least one of the second power regulators comprises a multi-threshold voltage sense circuit.

52. The power regulation system of claim 46, wherein at least one of the second power regulators comprises a multiple-bank output device.

* * * * *